(12) United States Patent
Do et al.

(10) Patent No.: US 10,217,647 B2
(45) Date of Patent: *Feb. 26, 2019

(54) METHOD OF MANUFACTURING SEMICONDUCTOR DEVICE

(71) Applicant: SAMSUNG ELECTRONICS CO., LTD., Suwon-si, Gyeonggi-Do (KR)

(72) Inventors: Jung-Ho Do, Yongin-si (KR); Jonghoon Jung, Seongnam-si (KR); Sanghoon Baek, Seoul (KR); Seungyoung Lee, Seoul (KR); Taejoong Song, Seongnam-si (KR); Jinyoung Lim, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/032,127

(22) Filed: Jul. 11, 2018

(65) Prior Publication Data

US 2018/0323082 A1  Nov. 8, 2018

Related U.S. Application Data

(63) Continuation of application No. 15/899,686, filed on Feb. 20, 2018, which is a continuation of application (Continued)

(30) Foreign Application Priority Data

Nov. 19, 2015 (KR) .................. 10-2015-0162675
Mar. 23, 2016 (KR) .................. 10-2016-0034831

(51) Int. Cl.
*H01L 21/8238* (2006.01)
*H01L 21/3213* (2006.01)

(52) U.S. Cl.
CPC ........... *H01L 21/32139* (2013.01); *H01L 21/823821* (2013.01); *H01L 21/823878* (2013.01); *H01L 21/823807* (2013.01)

(58) Field of Classification Search
CPC ........... H01L 21/308; H01L 21/3086; H01L 21/32139; H01L 21/76224; H01L 21/76229; H01L 21/823885
(Continued)

(56) References Cited

U.S. PATENT DOCUMENTS 6,044,007 A  3/2000 Capodieci
7,382,912 B2  6/2008 Zhang
(Continued)

*Primary Examiner* — Brook Kebede
(74) *Attorney, Agent, or Firm* — Volentine, Whitt & Francos, PLLC

(57) ABSTRACT

A method of manufacturing a semiconductor device may include forming active patterns, forming a polygonal mask pattern having a first width and a second width on the active patterns, forming an active region by executing a first etching process using the mask pattern, forming a first cutting mask for removing a first corner rounding in which a width of the active region is the first width, removing the first corner rounding by executing a second etching process using the first cutting mask, forming a second cutting mask for removing a second corner rounding in which the width of the active region is changed from the first width to the second width, and executing a third etching process using the second cutting mask.

18 Claims, 36 Drawing Sheets

Related U.S. Application Data

No. 15/350,716, filed on Nov. 14, 2016, now Pat. No. 9,929,023.

(58) Field of Classification Search
USPC .......................................... 438/212, 424–427
See application file for complete search history.

(56) References Cited

U.S. PATENT DOCUMENTS

| | | |
|---|---|---|
| 7,707,539 B2 | 4/2010 | Huang et al. |
| 8,527,916 B1 | 9/2013 | Chiang et al. |
| 9,104,833 B2 | 8/2015 | Kuo et al. |
| 9,929,023 B2 | 3/2018 | Do et al. |
| 2007/0148881 A1 | 6/2007 | Tseng et al. |
| 2007/0235785 A1* | 10/2007 | Kahng .............. H01L 29/42384 |
| | | 257/297 |
| 2009/0325360 A1* | 12/2009 | Lim .................... H01L 21/308 |
| | | 438/424 |
| 2013/0273711 A1 | 10/2013 | Liu et al. |
| 2014/0110241 A1 | 4/2014 | Deev |
| 2014/0317581 A1 | 10/2014 | Chuang et al. |
| 2015/0050810 A1 | 2/2015 | Lee et al. |
| 2015/0325572 A1 | 11/2015 | Cheng et al. |

\* cited by examiner

METHOD OF MANUFACTURING SEMICONDUCTOR DEVICE

PRIORITY STATEMENT

This U.S. non-provisional patent application is a continuation-in-part application of U.S. application Ser. No. 15/899,686 filed on Feb. 20, 2018, which is a continuation application of U.S. application Ser. No. 15/350,716 filed on Nov. 14, 2016, which claims priority under 35 U.S.C. § 119 of Korean Patent Application No. 10-2016-0034831, filed on Mar. 23, 2016, and Korean Patent Application No. 10-2015-0162675, filed on Nov. 19, 2015, the entire contents of which are hereby incorporated by reference.

BACKGROUND

The inventive concept relates to methods of manufacturing semiconductor devices, and more particularly, to a method of manufacturing a semiconductor device having an active region of a varying width.

As semiconductor devices become more highly integrated and a circuit configurations of the devices become more complex, the shape (footprint) of an active region such as a PMOS region and/or an NMOS region in which transistors are disposed is diversifying. As a result, there have been made many attempts to form a polygonal active region that breaks away from an existing tetragonal active region. However, a corner of the active region, unlike what was intended at the time of a layout design, is not accurately formed and a corner rounding phenomenon where a corner becomes rounded may occur.

This corner rounding phenomenon causes a serious error in an actual semiconductor device. That is, a standard cell disposed near an active region of a rounded corner may not operate and an electrical short may occur between the standard cell and other standard cells or between the standard cell and a conductive line. Thus, it is very important to prevent a corner rounding phenomenon from occurring in an active region especially one whose width varies along the direction of its length.

SUMMARY

The inventive concept provide examples of a manufacturing method of a semiconductor device which include forming first trenches that define active patterns extending in a first direction on a substrate, forming a first insulating layer filling the first trenches, forming first mask patterns extending in the first direction and each of which has a first width along a second direction perpendicular to the first direction, forming a second mask pattern extending in the first direction while having a second width along the second direction, forming a second trench that forms a partly defined active region by executing a first etching process that etches the active patterns and the first insulating layer using the first mask patterns and the second mask pattern, and forming a second insulating layer filling the second trench.

The inventive concept also provides examples of a manufacturing method of a semiconductor device which include forming first trenches that define active patterns extending in a first direction on a substrate, forming a first insulating layer filling the first trenches, forming a first mask pattern extending in the first direction and which has a first width along a second direction perpendicular to the first direction, forming a second mask pattern extending in the first direction and which has a second width along the second direction, forming a second trench that forms a partly defined active region by executing a first etching process that etches the active patterns and the first insulating layer using the first mask pattern and the second mask pattern, and forming a second insulating layer filling the second trench.

The inventive concept also provides examples of a manufacturing method of a semiconductor device which include forming, in a semiconductor substrate, first trenches that delimit parallel linear active patterns spaced apart from one another in a first direction and each extending longitudinally in a second direction perpendicular to the first direction, forming a first insulating layer filling the first trenches, executing a first patterning process to form at least one first mask pattern and executing a second patterning process, discrete from the first patterning process to form a second mask pattern before or after the at least one first mask pattern is formed, executing a first etching process, using the first and second mask patterns as an etch mask, to remove sections of the active patterns and the first insulating layer and thereby form a second trench, and forming a second insulating layer filling the second trench. Each first mask pattern lies over at least part of a respective one of the active patterns and has a side extending in the second direction parallel to the active patterns, and the second mask pattern has a side extending in the first direction and which meets the side of each said at least one first mask pattern as viewed in plan. Thus, a side of the second mask pattern subtends a right angle with a side of each first mask pattern as viewed in plan;

BRIEF DESCRIPTION OF THE FIGURES

The above and/or other aspects will be more apparent by referring to the detailed description, which follows, of examples of the inventive concept as made with reference to the accompanying drawings.

DETAILED DESCRIPTION

Below, examples of the inventive concept will now be described more fully so that those skilled in the art can easily comprehend the inventive concept.

Figure 1:
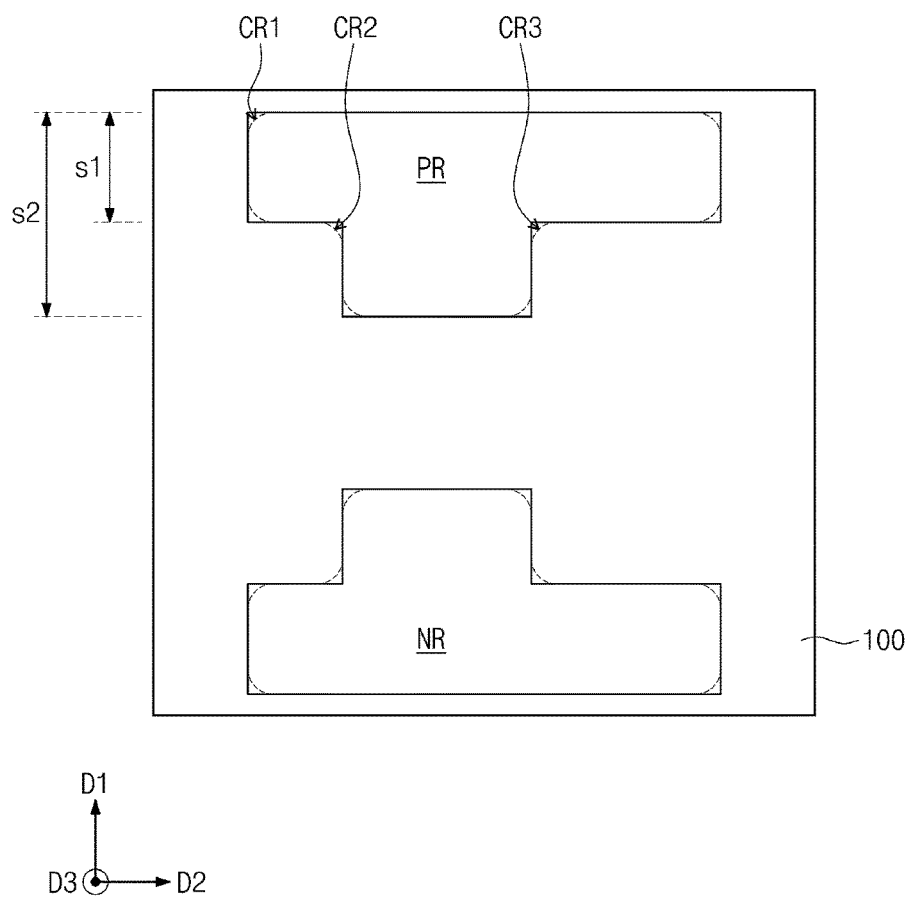
FIG. 1 is a plan view of a semiconductor device in accordance with the inventive concept.
Figure 2A:
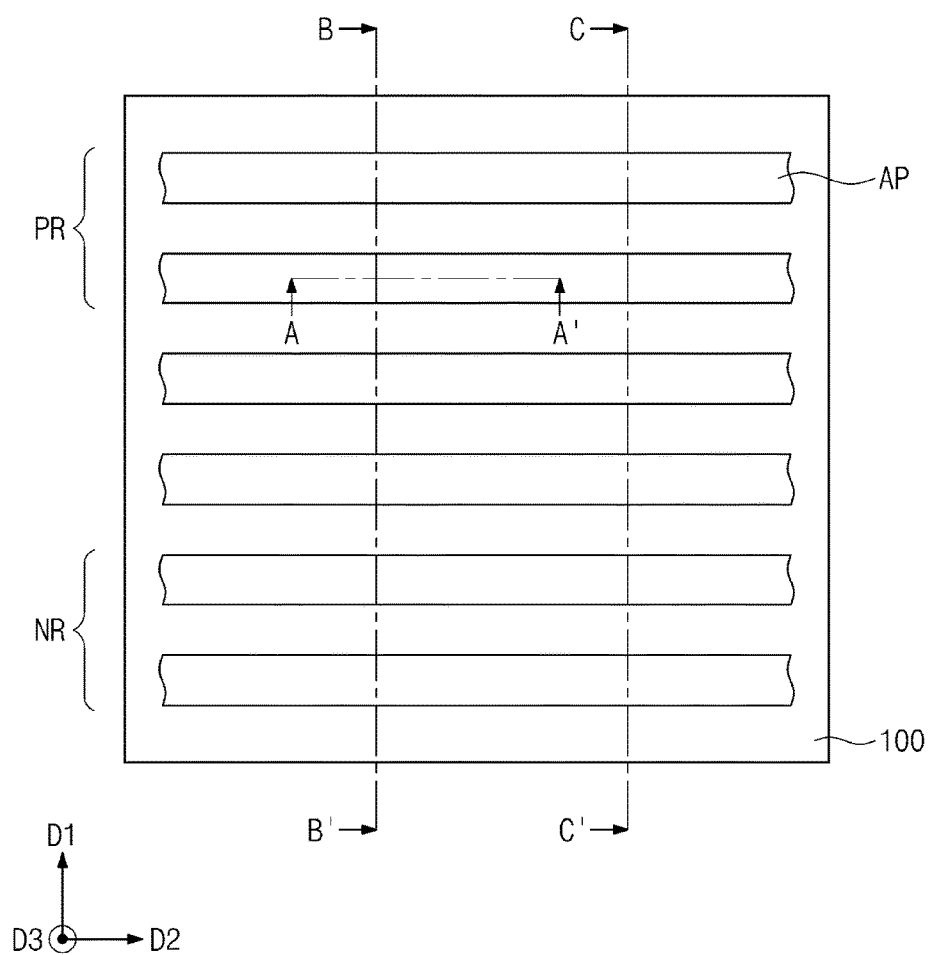
FIGS. 2A, 3A, 4A, 5A, 6A, 7A, 8A, 9, 10A and 11A are plan views for explaining a method of manufacturing a semiconductor device in accordance with the inventive concept.
Figure 2B:
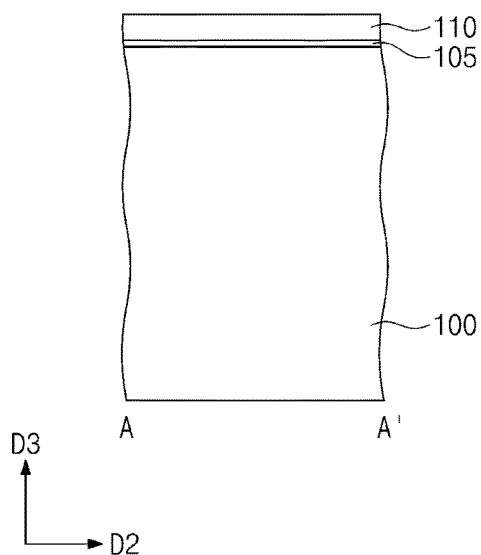
FIGS. 2B, 3B, 4B, 5B, 6B, 7B, 8B, 10B and 11B are cross-sectional views taken along respective lines A-A' of the FIGS. 2A, 3A, 4A, 5A, 6A, 7A, 8A, 10A and 11A.
Figure 2C:
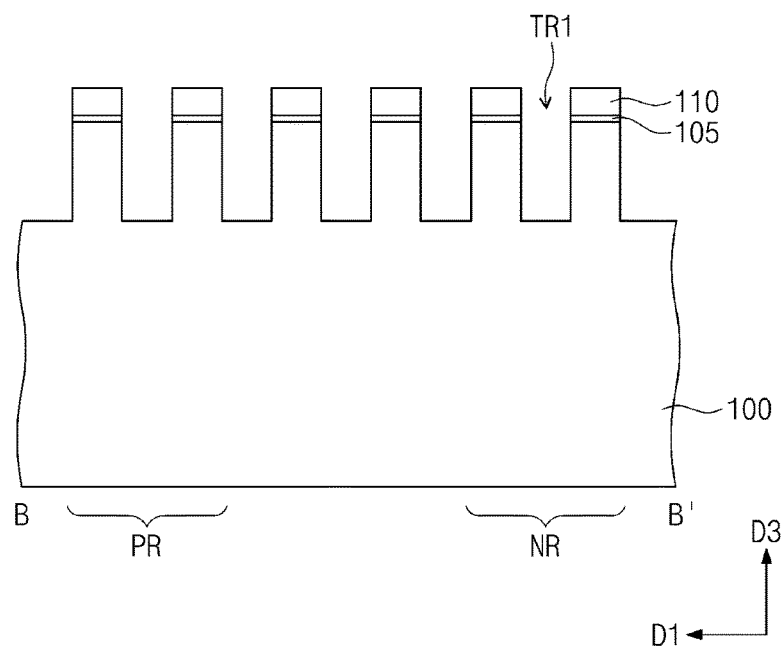
FIGS. 2C, 3C, 4C, 5C, 6C, 7C, 8C, 10C and 11C are cross-sectional views taken along respective lines B-B' of the FIGS. 2A, 3A, 4A, 5A, 6A, 7A, 8A, 10A and 11A.
Figure 2D:
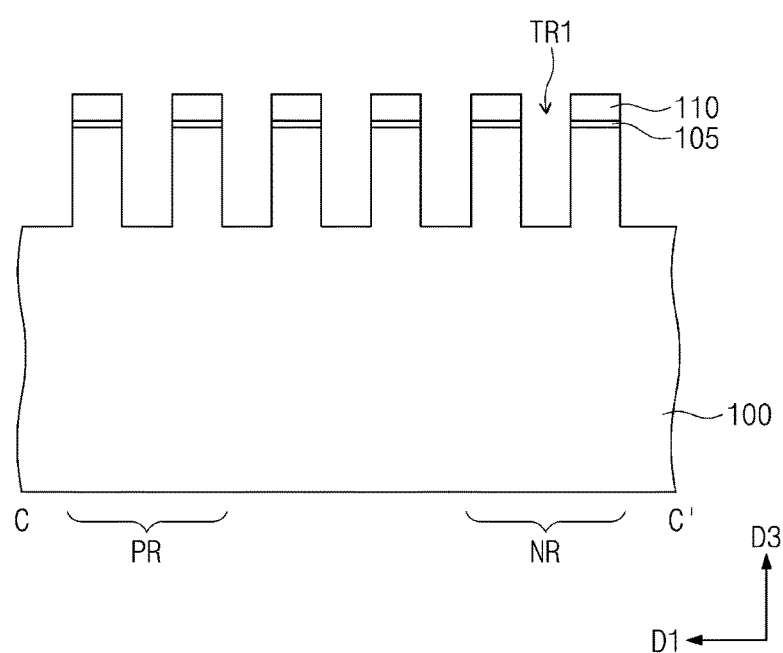
FIGS. 2D, 3D, 4D, 5D, 6D, 7D, 8D, 10D and 11D are cross-sectional views taken along respective lines C-C' of the FIGS. 2A, 3A, 4A, 5A, 6A, 7A, 8A, 10A and 11A.
Figure 3A:
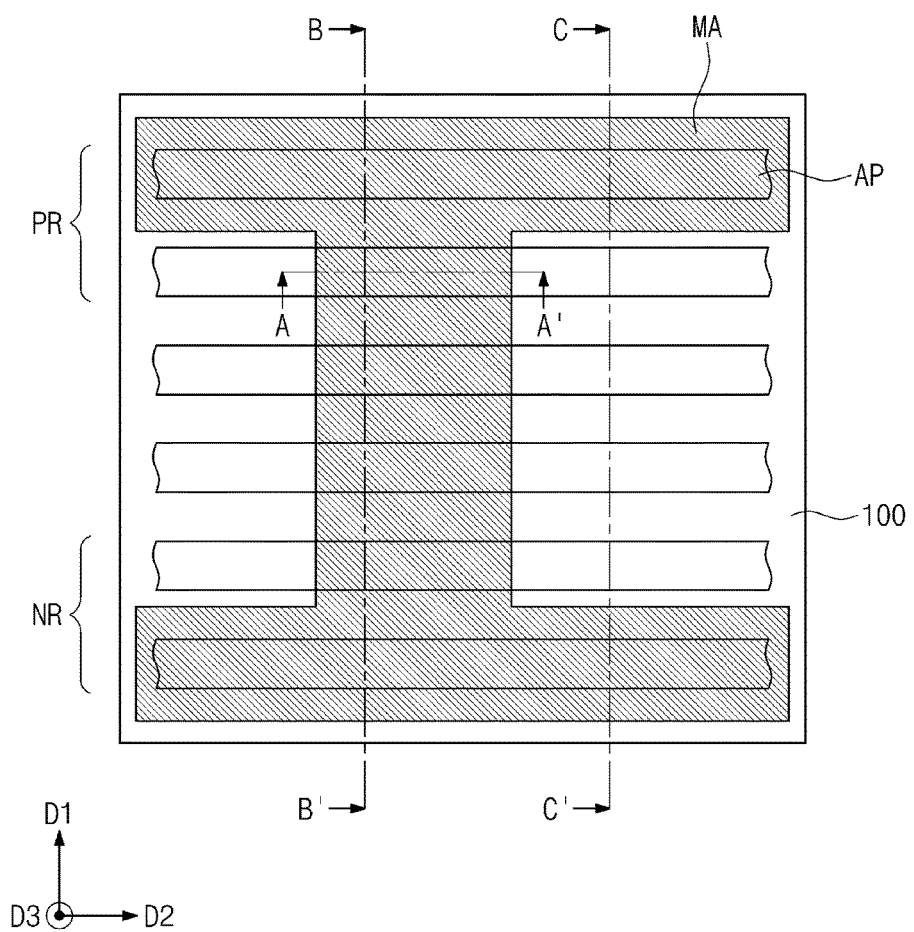
Figure 3B:
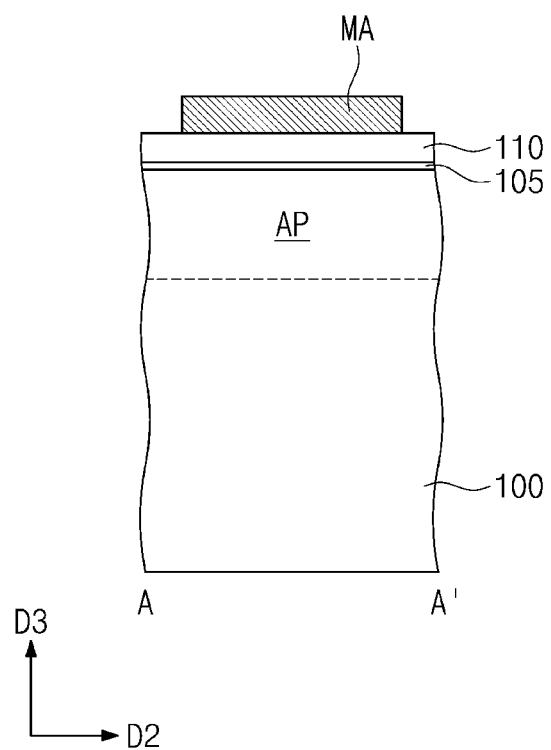
Figure 3C:
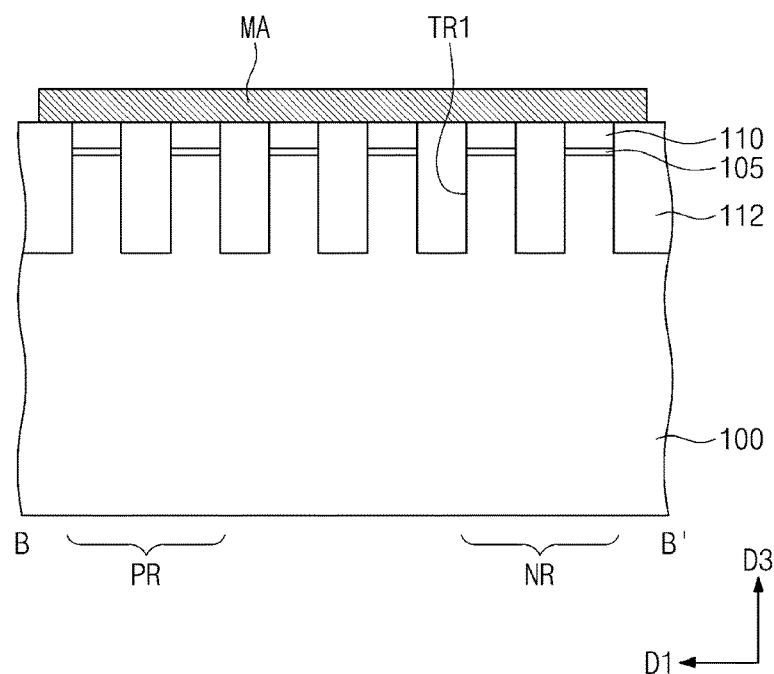
Figure 3D:
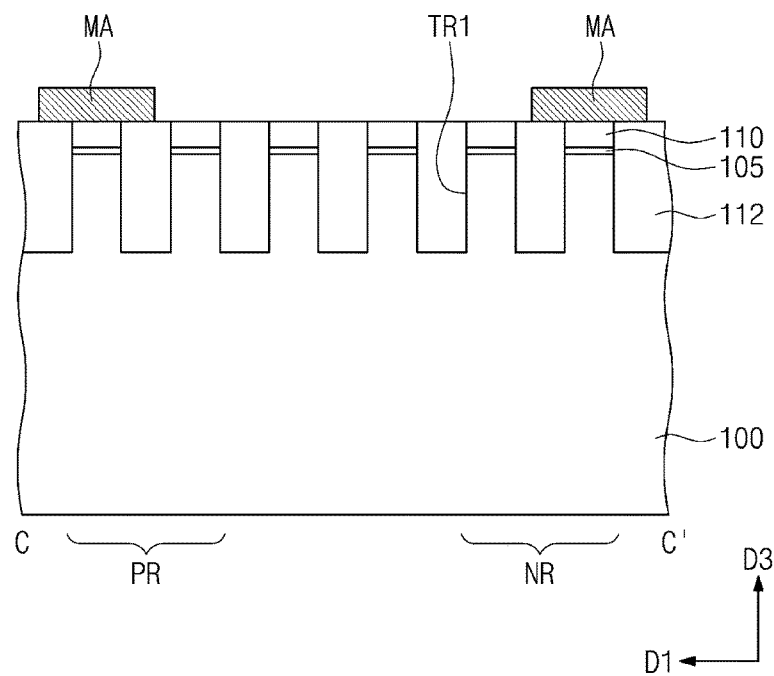

FIG. 1 is a plan view or layout of a semiconductor device that can be manufactured in accordance with the inventive concept. Referring to FIG. 1, a semiconductor device may include at least one active region (e.g., a PMOS region PR and/or an NMOS region NR) formed on a substrate 100. For example, the PMOS region PR and the NMOS region NR may be formed to have a shape which is not merely tetragonal but rather a shape of a rectilinear polygon having more than four sides. Here, as well as in common usage, a rectilinear polygon refers to a polygon whose sides each extend in either of two directions orthogonal to each other and thus, may also be referred to as an orthogonal polygon. The shapes of the PMOS region PR and the NMOS region NR shown in FIG. 1 are only illustrative, though. and to aid in explaining the inventive concept, i.e., the inventive concept is not limited to the manufacture of a semiconductor device having an active region(s) in the shape illustrated in FIG. 1.

In general, as the resolution of a semiconductor manufacturing process increases, a desired right angle at a corner(s) of an active region is not formed. That is, a rounding phenomenon (i.e., a corner rounding) may occur in an active region where right-angled corners are desired and the corner rounding is illustrated by CR1, CR2 and CR3 in FIG. 1. Especially, in the case of forming an active region having a width along a first direction D1 which increases from s1 to s2 or decreases from s2 to s1, the corner rounding may be rather pronounced so as to create a serious problem in the final device.

However, according to examples of the inventive concept, a corner rounding (e.g., CR1) that may occur in an active region is removed using a separate cutting mask (not illustrated). A corner rounding that may occur at a position where a width of an active region changes (e.g., the CR2 at which a width of the active region changes from s1 to s2 and the CR3 at which a width of the active region changes from s2 to s1) may be removed by forming an active region using at least two masks. A detailed manufacturing method of a semiconductor device will be described with reference to FIG. 2.

FIGS. 2A, 3A, 4A, 5A, 6A, 7A, 8A, 9, 10A and 11A are plan views for explaining examples of a method of manufacturing semiconductor device in accordance with the inventive concept. FIGS. 2B, 3B, 4B, 5B, 6B, 7B, 8B, 10B and 11B are cross-sectional views taken along respective lines A-A' of the FIGS. 2A, 3A, 4A, 5A, 6A, 7A, 8A, 10A and 11A. FIGS. 2C, 3C, 4C, 5C, 6C, 7C, 8C, 10C and 11C are cross-sectional views taken along respective lines B-B' of the FIGS. 2A, 3A, 4A, 5A, 6A, 7A, 8A, 10A and 11A. FIGS. 2D, 3D, 4D, 5D, 6D, 7D, 8D, 10D and 11D are cross-sectional views taken along respective lines C-C' of the FIGS. 2A, 3A, 4A, 5A, 6A, 7A, 8A, 10A and 11A.

Referring to FIGS. 2A through 2D, active patterns (AP) may be formed by patterning a substrate 100. For example, the substrate 100 may be a silicon substrate, a germanium substrate, or a SOI (silicon on insulator) substrate. The active patterns (AP) may have a line or bar shape each extending in a second direction D2, perpendicular to the first direction D1, along a top surface of the substrate 100 and spaced apart from each other in the first direction D1, so at to be parallel to each other. Note, the terns first direction and second direction are for reference only and may be used interchangeably but consistently with respect to relative orientations of the features being described. That is, the first direction D1 shown in the drawings may at times be referred to as a second direction in which case the second direction D2 will be referred to as a first direction.

The forming of the active patterns (AP) may include forming first trenches TR1 that define the active patterns (AP) by etching an upper portion of the substrate 100. A depth of the first trenches TR1 may be greater than a width of the active patterns (AP).

The forming the first trenches TR1 may include forming a mask 110 (or simply "mask") on the substrate 100, and then anisotropically etching the substrate 100 using the mask 110 as an etch mask. For example, the mask 110 may include a plurality of layers sequentially stacked while having an etching selectivity with respect to one another. The mask 110 may include a silicon nitride layer. Before the mask 110 is formed, a buffer layer 105 may be formed on the substrate 100. The buffer layer 105 may include a silicon oxide layer or a silicon nitride layer.

Referring to FIGS. 3A through 3D, the first insulating layer 112 filling the first trenches TR1 may be formed. The first insulating layer 112 may be formed so that top surfaces of the mask 110 are exposed. The first insulating layer 112 may include a silicon oxide layer. The first insulating layer 112 may be a flowable chemical vapor deposition (FCVD) oxide layer. The forming of the first insulating layer may include depositing the first insulating layer 112 on an entire surface of the substrate 100, and then planarizing the first insulating layer 112 until the mask 110 is exposed.

A mask pattern MA may be formed on the first insulating layer 112. The mask pattern MA may have a polygonal shape. For example, a portion of the mask pattern MA may extend in the first direction D1 and the remaining portion of the mask pattern MA may extend in the second direction D2. The mask pattern MA may overlap a plurality of active patterns (AP) in a plan viewpoint or a top view. For example, the mask pattern MA may include a plurality of layers sequentially stacked while having an etching selectivity with respect to on another. The mask patterns MA may be formed using a photoresist pattern.

Figure 4A:
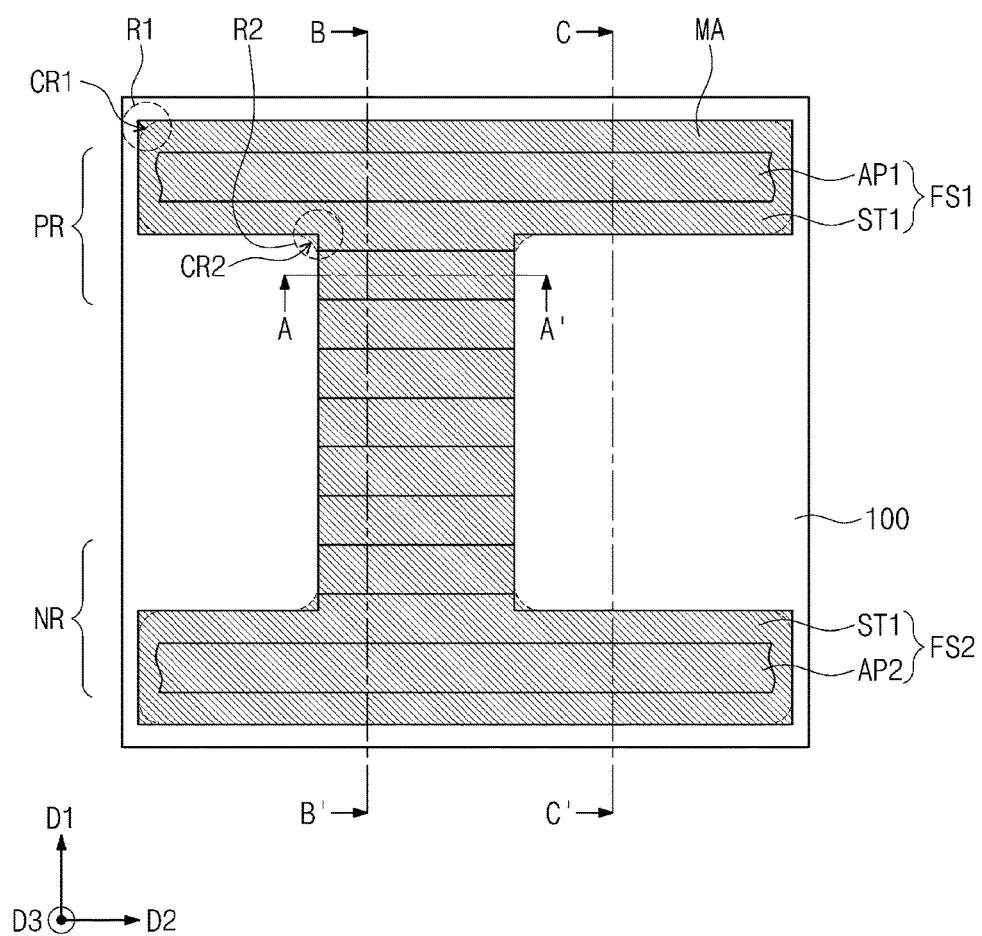
Figure 4B:
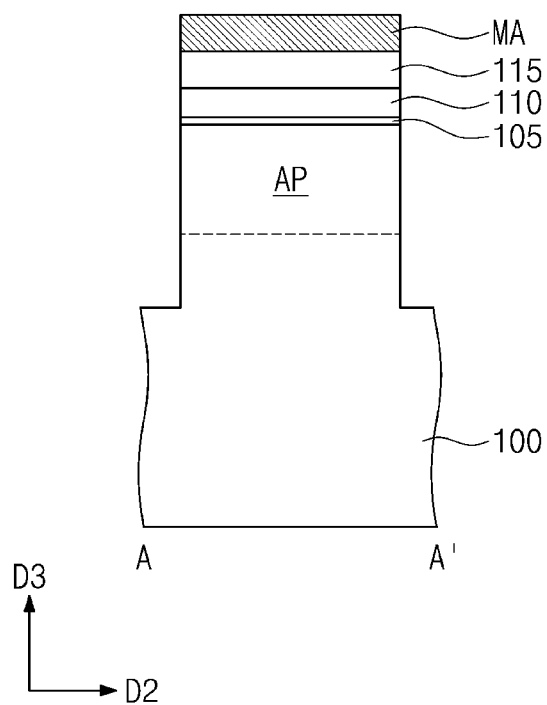
Figure 4C:
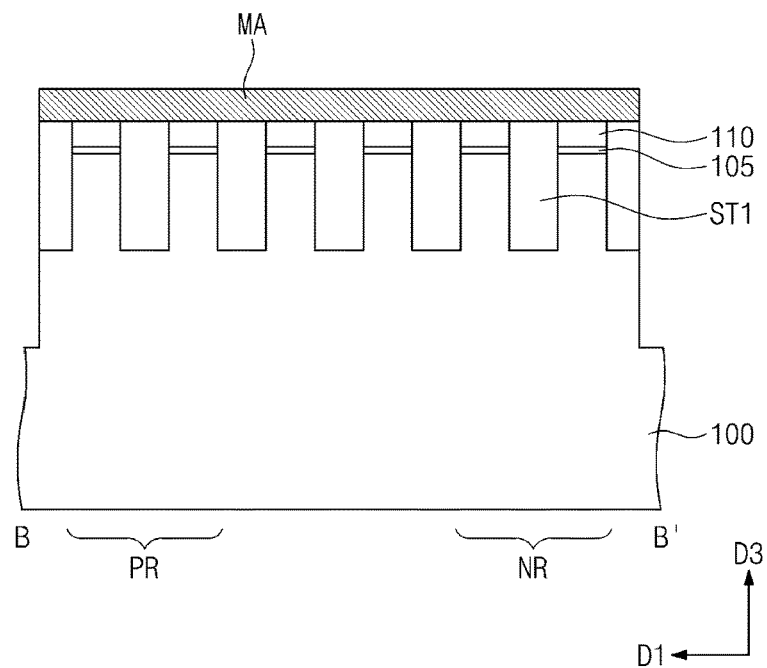
Figure 4D:
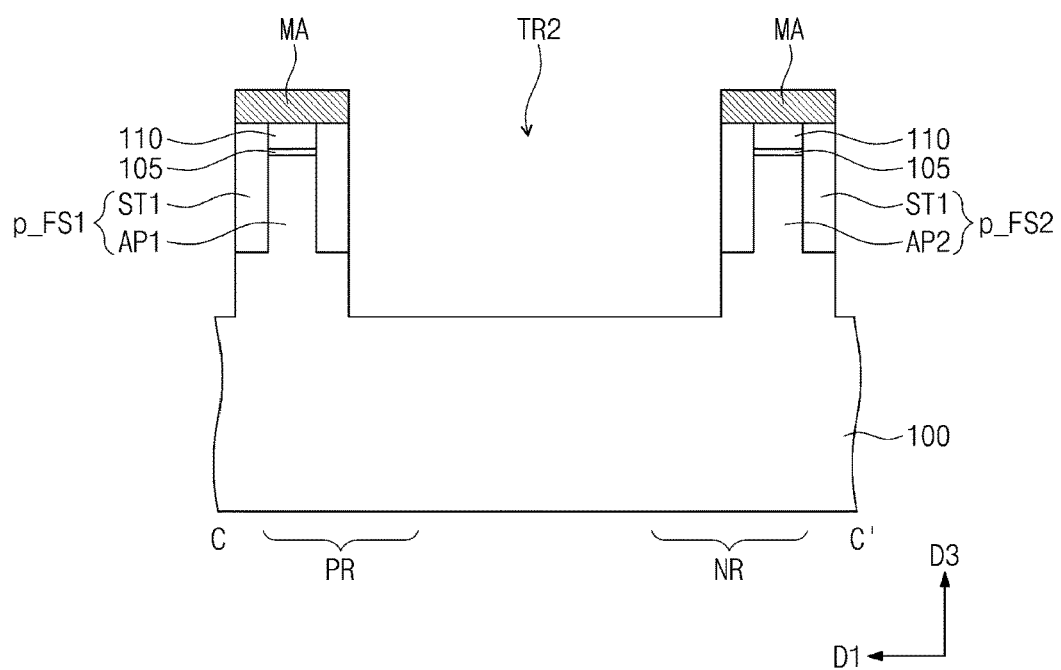
Figure 5A:
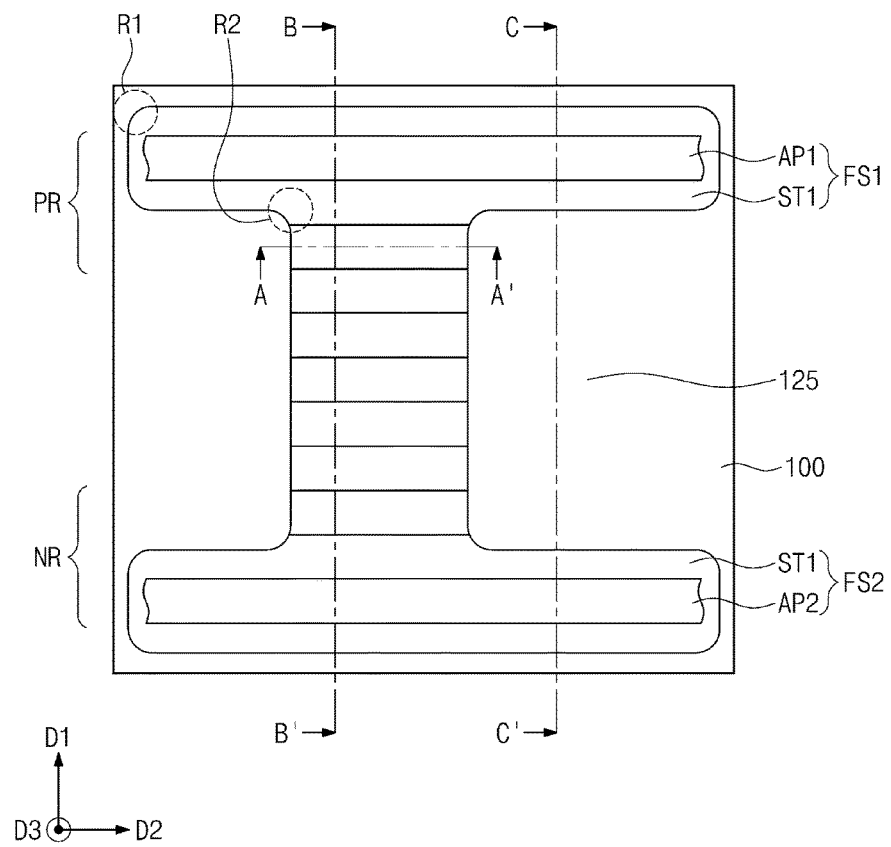
Figure 5B:
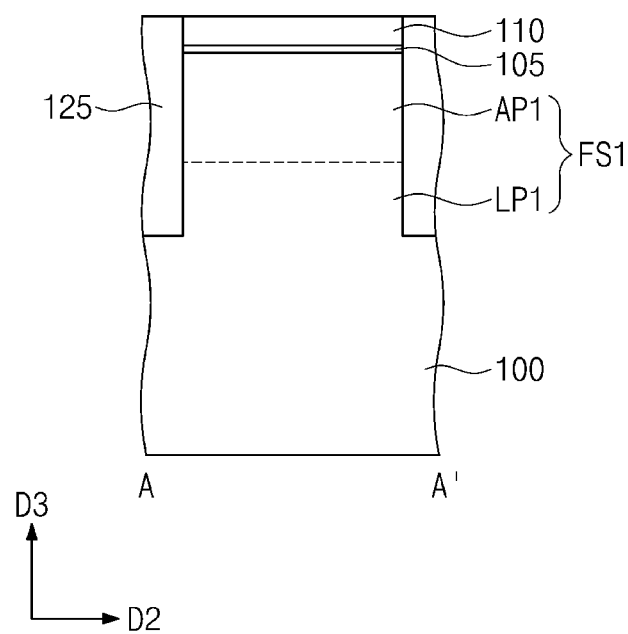
Figure 5C:
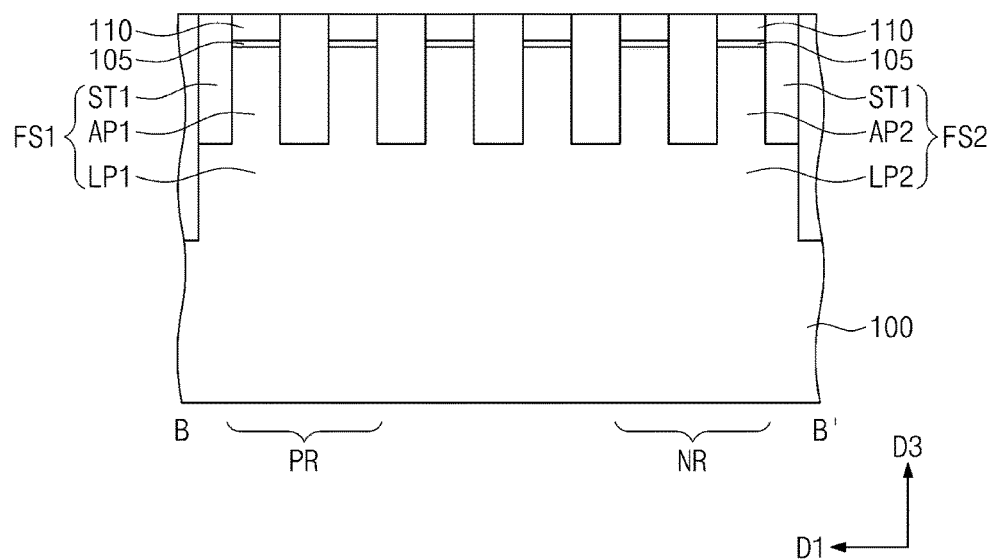
Figure 5D:
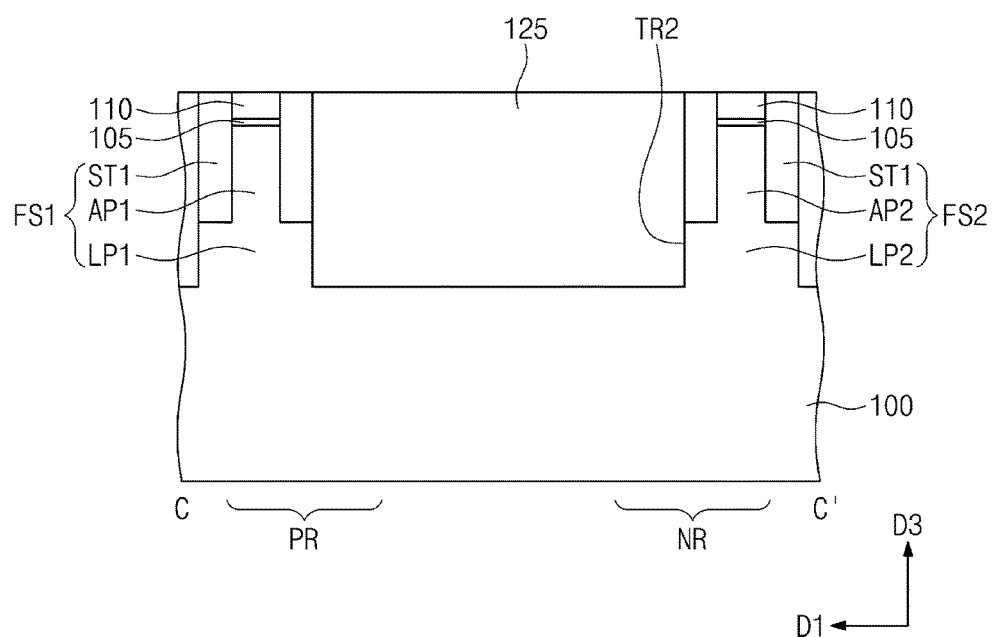
Figure 6A:
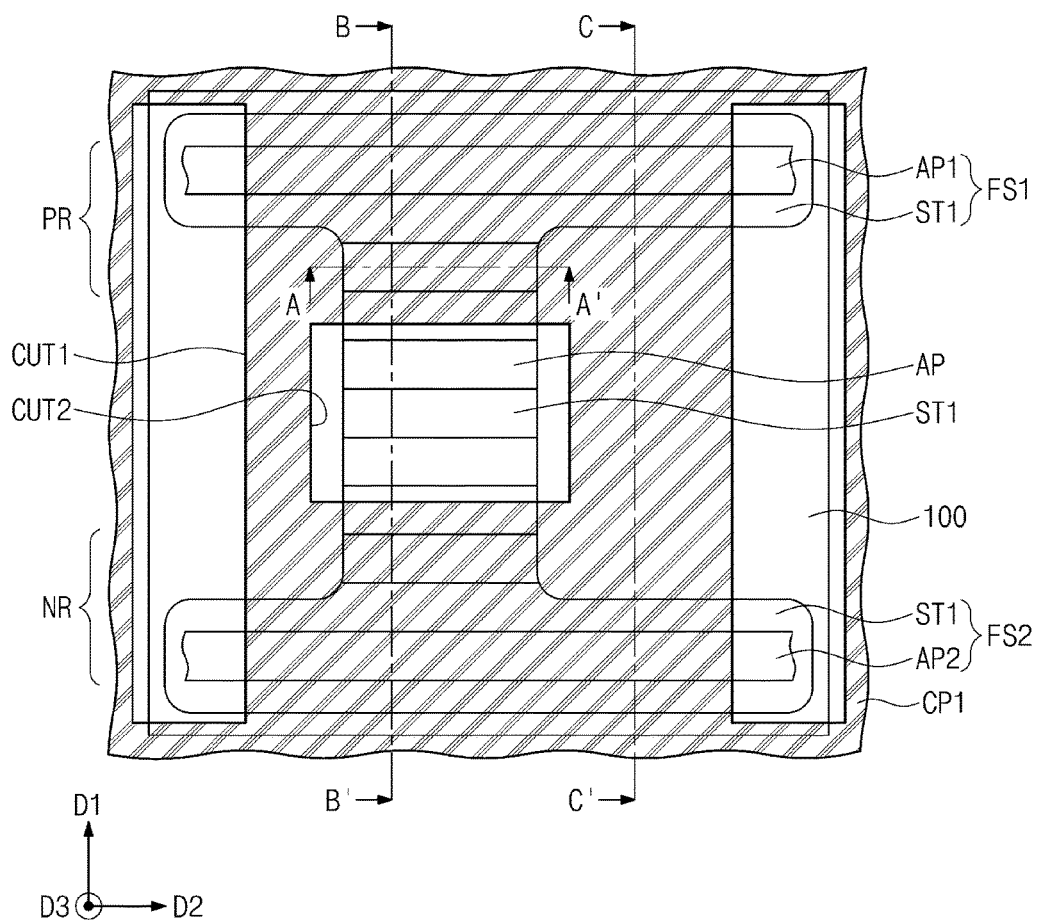
Figure 6B:
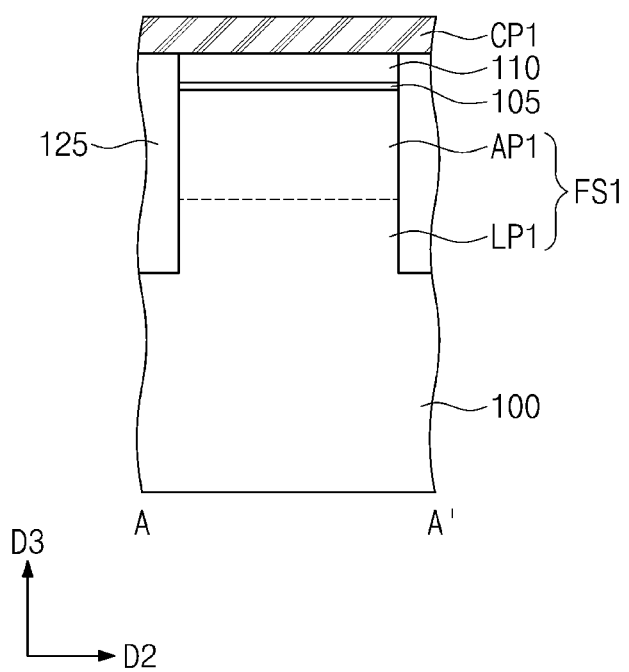
Figure 6C:
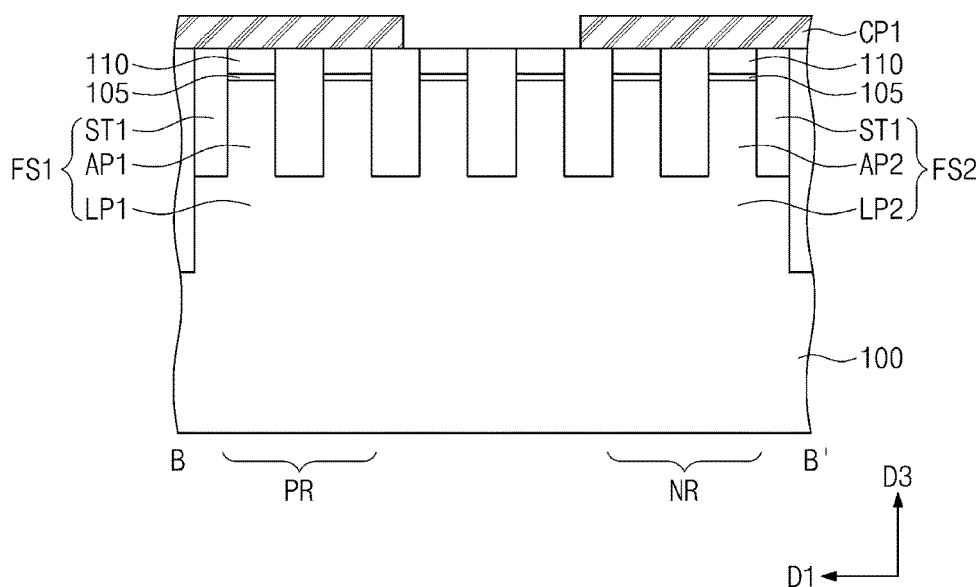
Figure 6D:
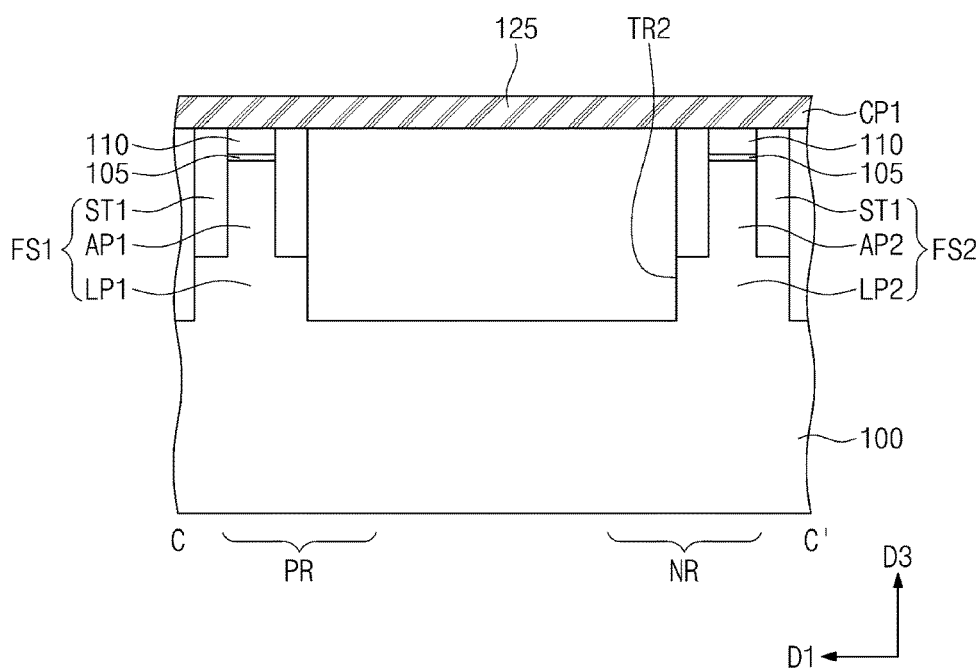
Figure 7A:
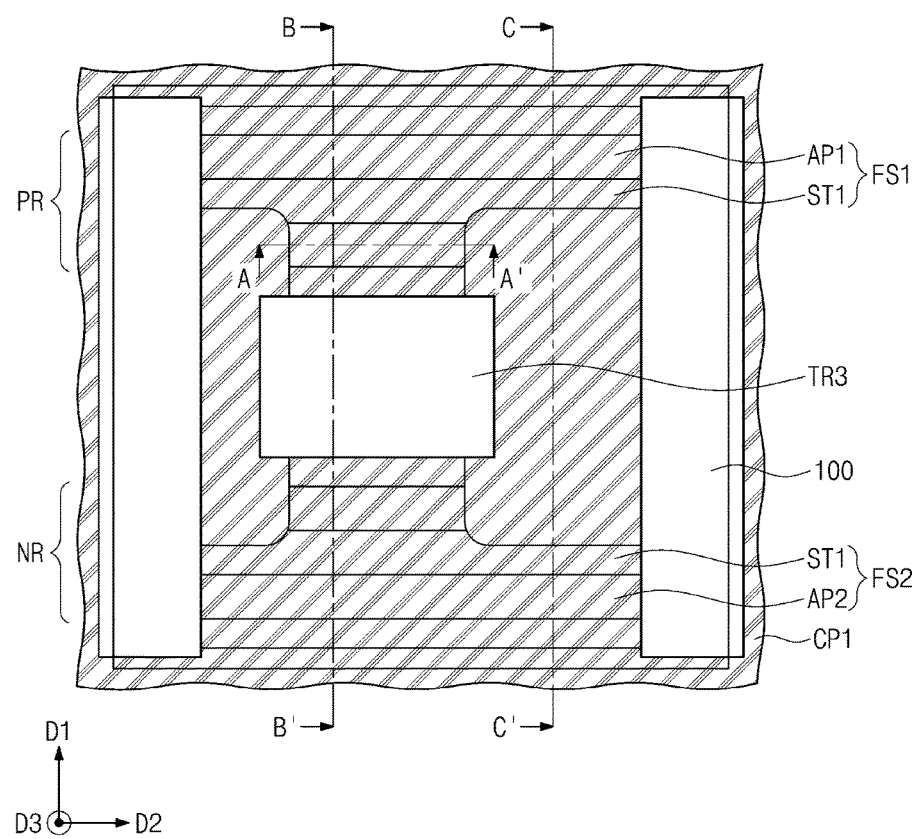
Figure 7B:
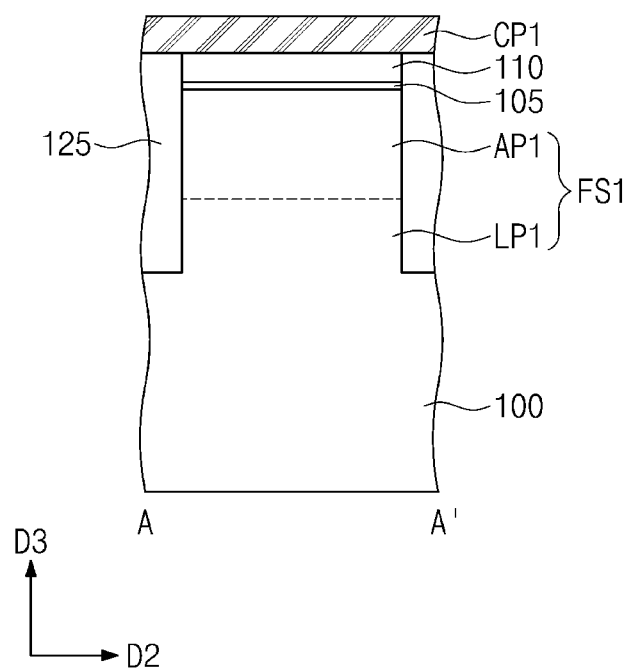
Figure 7C:
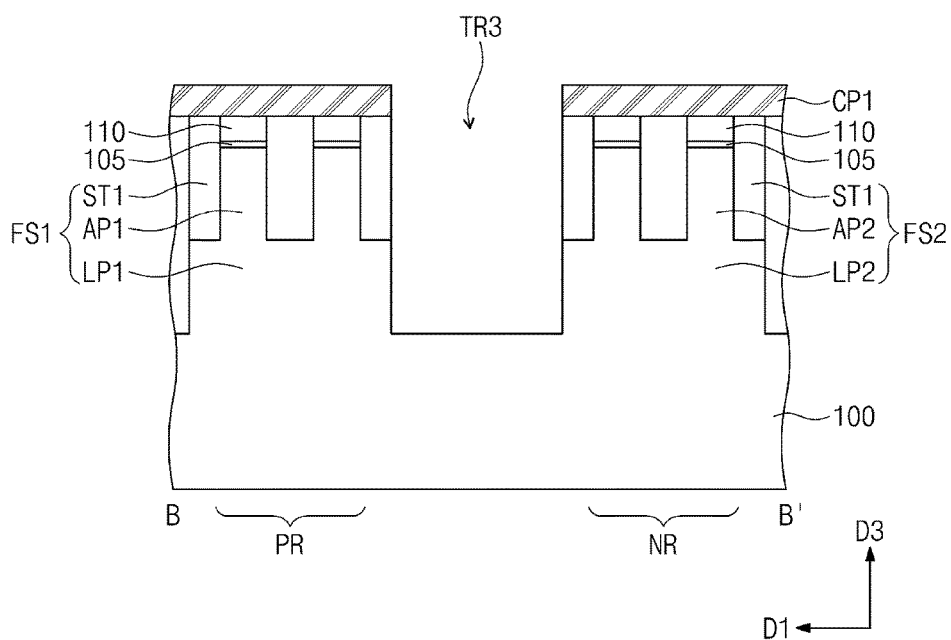
Figure 7D:
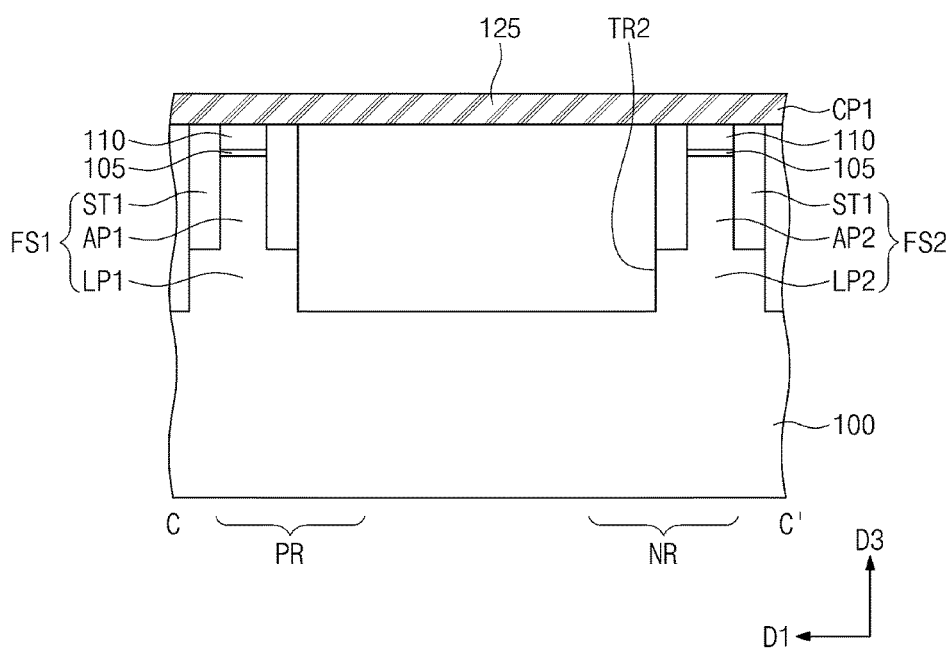
Figure 8A:
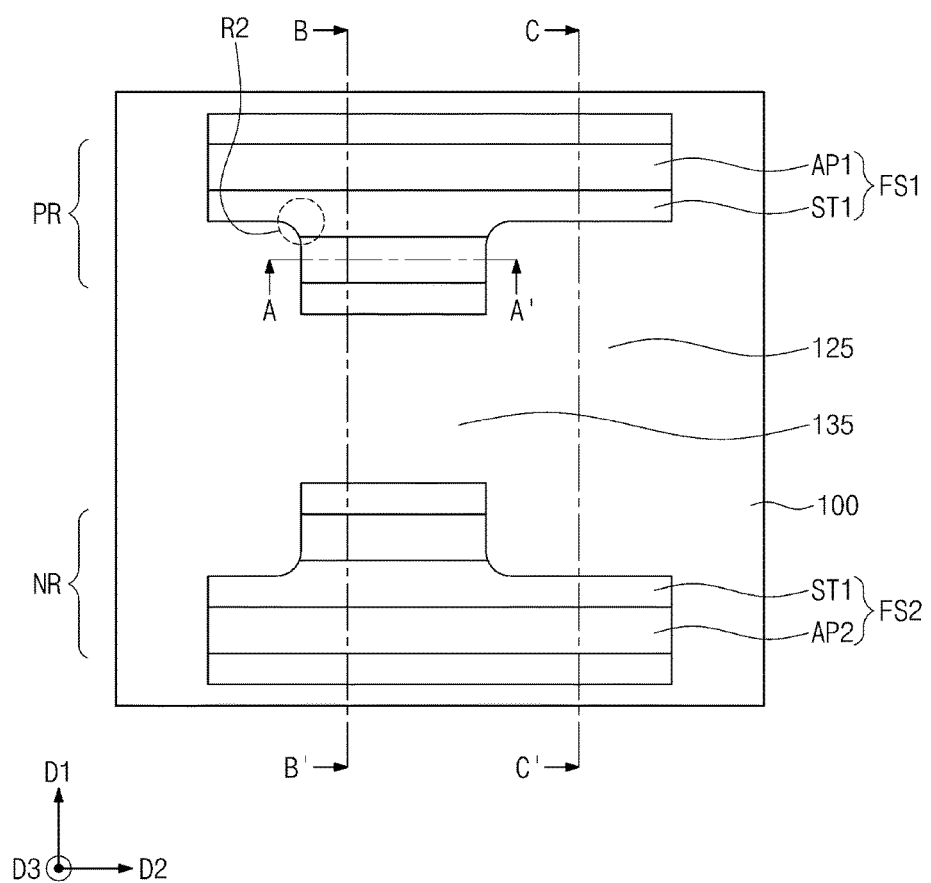
Figure 8B:
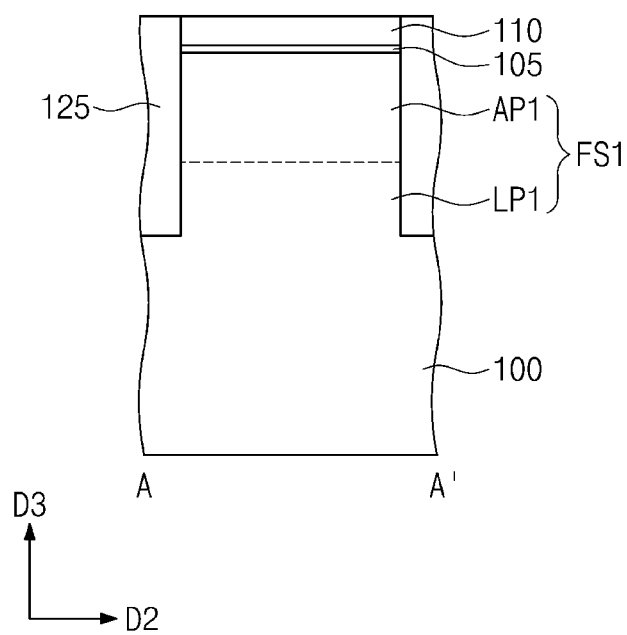
Figure 8C:
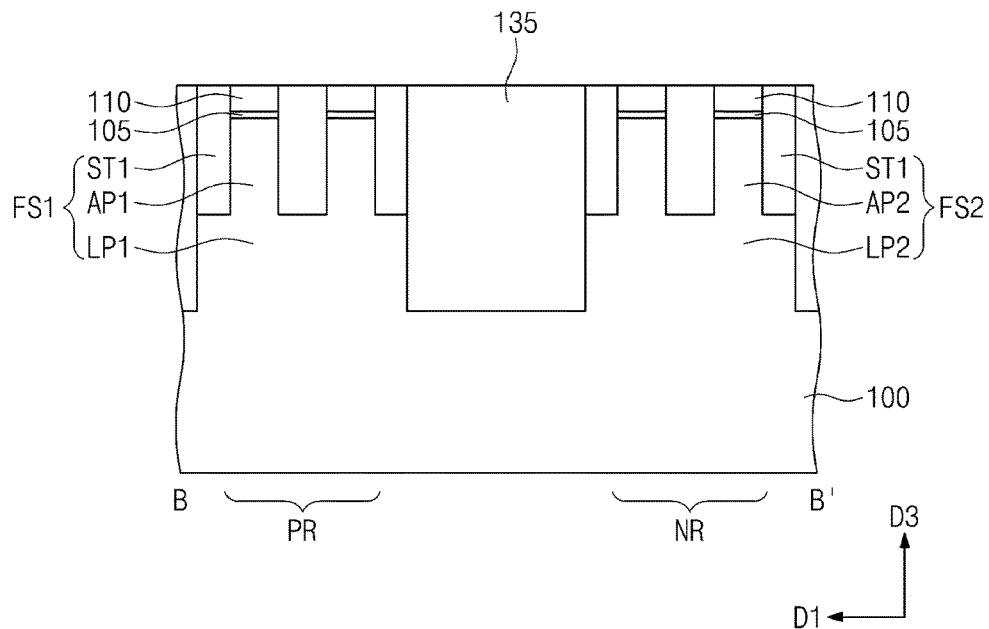
Figure 8D:
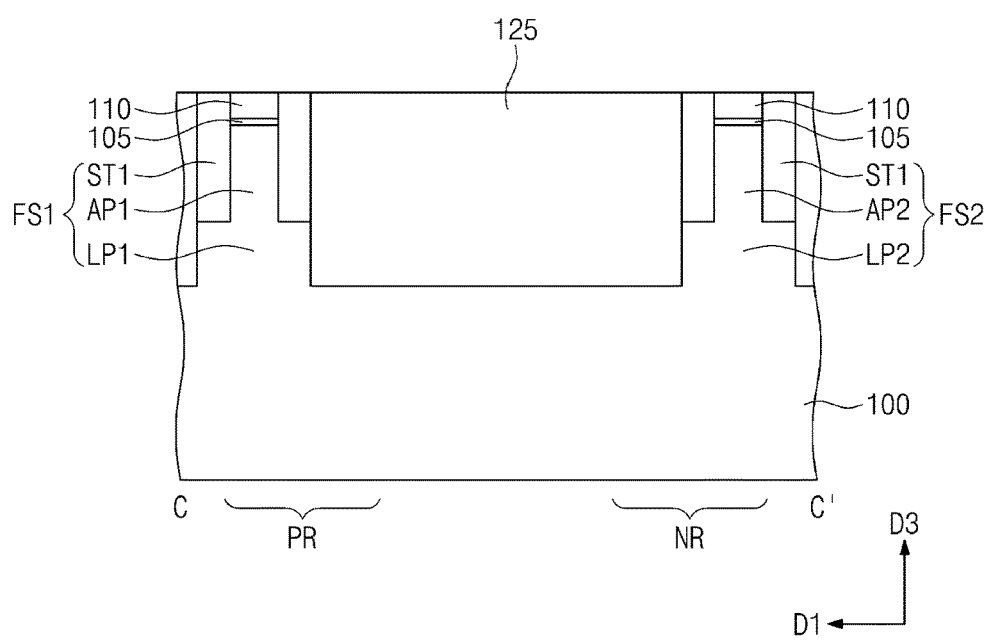

Referring to FIGS. 4A and 4D, preliminary fin structures p_FS1 and p_FS2, and a second trench TR2 that defines a PMOS region PR and an NMOS region NR may be formed by performing a first etching process. The first etching process may include etching the mask 110, the buffer layer 105, the active patterns (AP), and first insulating layer 112 using the mask pattern MA as an etch mask. As a result of the first etching process, the preliminary fin structures p_FS1 and p_FS2 may be formed. For example, the preliminary fin structure p_FS1 formed on the PMOS region PR may include an active pattern AP1 and a pair of first device isolation patterns ST1 disposed on both sides of the active pattern AP1. The preliminary fin structure p_FS2 formed on the NMOS region NR may include an active pattern AP2 and a pair of first device isolation patterns ST1 disposed on both sides of the active pattern AP2.

During the first etching process, active patterns (AP) exposed by the mask pattern MA may be removed. A part of the first insulating layer 112 exposed by the mask pattern MA may be removed. The part of the first insulating layer 112 and the active patterns (AP) are removed and as a result, the second trench TR2 that partly defines the PMOS region PR and the NMOS region NR is formed (and either or both of which may be referred to as a "partly defined active region"). As another result, the preliminary fin structure p_FS1 on the PMOS region PR and the preliminary fin structure p_FS2 on the NMOS region NR may be additionally defined.

As a result of the first etching process, corner roundings (CR1, CR2) due to a miniature of a semiconductor manufacturing process may be formed at the corners (e.g., R1, RE, etc.) of the mask pattern MA.

Referring to FIGS. 5A through 5D, the mask pattern MA may be removed.

A second insulating layer 125 filling the second trench TR2 may be formed. The second insulating layer 125 may be formed so that a top surface of the mask 110 is exposed. For example, the second insulating layer 125 may include a silicon oxide layer. The second insulating layer 125 may include at least one of a high density plasma (HDP) oxide layer, TEOS (tetraethyl orthosilicate), PE-TEOS (plasma enhanced tetraethyl orthosilicate), O3-TEOS (O3-tetraethyl orthosilicate), USG (undoped silicate glass), PSG (phosphosilicate glass), BSG (borosilicate glass), BPSG (borophosphosilicate glass), FSG (fluoride silicate glass), and SOG (spin on glass).

For example, the forming of the second insulating layer 125 may include depositing the second insulating layer 125 on an entire surface of the substrate 100 and then planarizing the second insulating layer 125 until the mask 110 is exposed.

Referring to FIGS. 6A through 6D, a first cutting mask (CP1) may be formed on the mask 110, the first device isolation patterns ST1 and the second insulating layer 125.

For example, the cutting mask (CP) may include a plurality of layers sequentially stacked while having an etching selectivity with respect to one another. The first cutting mask (CP1) may be formed using—photoresist patterns. Although it is illustrated in the drawings that the first cutting mask (CP1) includes the first cutting region (CUT 1) and the second cutting region (CUT 2), in some embodiments, the first cutting region (CUT 1) and the second cutting region (CUT 2) may be formed on different cutting masks respectively.

As illustrated in the drawings, the cutting mask (CP) may be formed to have openings such that a portion to be cut is exposed. For example, one opening of the cutting mask (CP) is located over one or more rounded corners of the partially defined active region exposed in a first cutting region (CUT 1) so that the rounded corner(s) may be removed through a second etching process. Another opening in the cutting mask (CP) may be located over the active patterns (AP) and the first device isolation patterns ST1 exposed in a second cutting region (CUT 2) so that those active patterns (AP) and isolation patterns ST1 are removed thereby creating the separation between the PMOS region PR and the NMOS region NR.

Referring to FIGS. 7A through 7D, a third trench TR3 that defines the PMOS region PR and the NMOS region NR may be formed by performing the second etching process. While the PMOS region PR and the NMOS region NR are partly formed/defined by the first etching process, the PMOS region PR and the NMOS region NR may be completed by the second etching process. The second etching process may include etching the mask 110, the buffer layer 105, the active patterns (AP) and the first insulating layer 112 using the first cutting mask (CP1) as an etch mask.

During the second etching process, active patterns (AP) exposed by the first cutting mask (CP1) may be removed. A portion of the first insulating layer 112 exposed by the first cutting mask (CP1) may be removed. The portion of the first insulating layer 112 and the active patterns (AP) are removed and as a result the third trench TR3 that completely defines the PMOS region PR and the NMOS region NR may be formed.

As described in the embodiments of FIGS. 6A through 6D, in case that the first cutting region (CUT1) and the second cutting region (CUT2) are formed on different two cutting masks respectively, a plurality of etching processes may be performed. For example, an etching process for removing active patterns (AP) exposed in the first cutting region (CUT1) may be performed and other etching process for removing active patterns (AP) exposed in the second cutting region (CUT1) may be performed. Thereafter, the first cutting mask (CP1) may be removed.

Referring to FIGS. 8A through 8D, the cutting mask (CP) may be removed.

A third insulating layer 135 filling the third trench TR3 may be formed. The third insulating layer 135 may be formed so that the mask 110 is exposed. For example, the third insulating layer 135 may include a silicon oxide layer. The third insulating layer 135 may include at least one of a high density plasma (HDP) oxide layer, TEOS (tetraethyl orthosilicate), PE-TEOS (plasma enhanced tetraethyl orthosilicate), O3-TEOS (O3-tetraethyl orthosilicate), USG (undoped silicate glass), PSG (phosphosilicate glass), BSG (borosilicate glass), BPSG (borophosphosilicate glass), FSG (fluoride silicate glass), and SOG (spin on glass).

For example, the forming the third insulating layer 135 may include depositing the third insulating layer 135 on an entire surface of the substrate 100 and then planarizing the third insulating layer 135 until the mask 110 is exposed.

Even though corner roundings were removed using the first cutting mask (CP1), a corner rounding of the corner R2 is not removed. For instance, there may be a rounding in the active pattern (AP) near the corner R2 of FIG. 8A and the rounding may affect performance of a semiconductor device. Therefore, an additional process for removing the corner rounding near the corner R2 may be performed.

Figure 9:
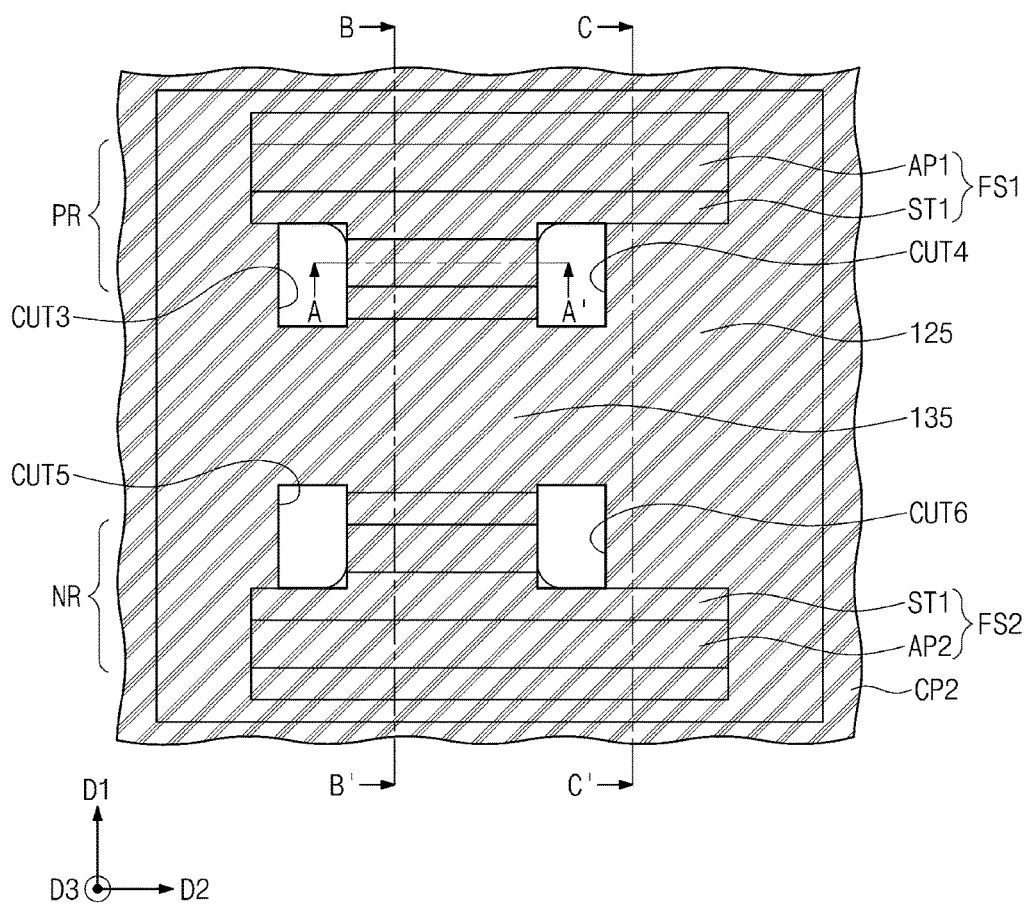
Figure 10A:
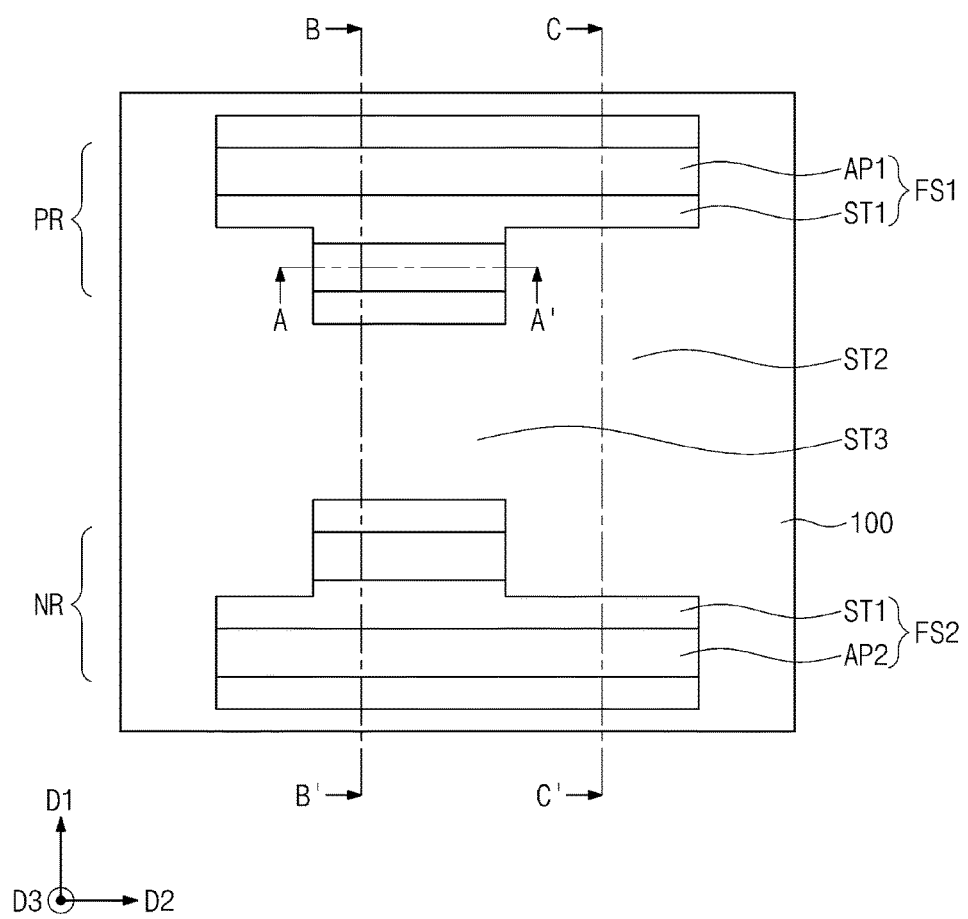
Figure 10B:
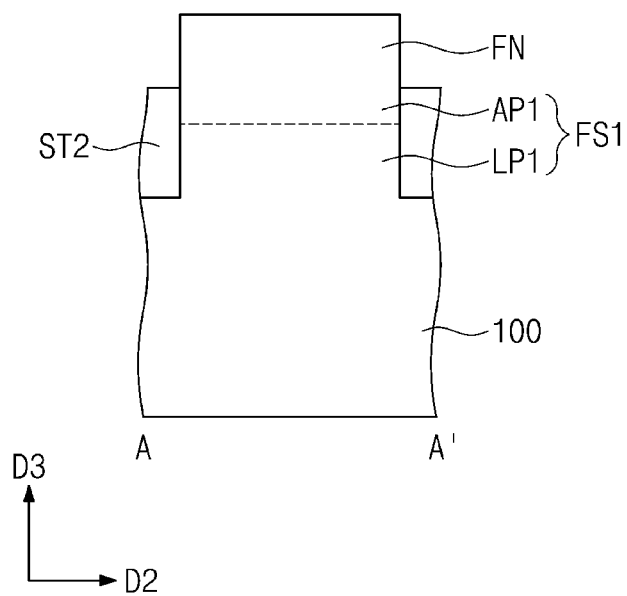
Figure 10C:
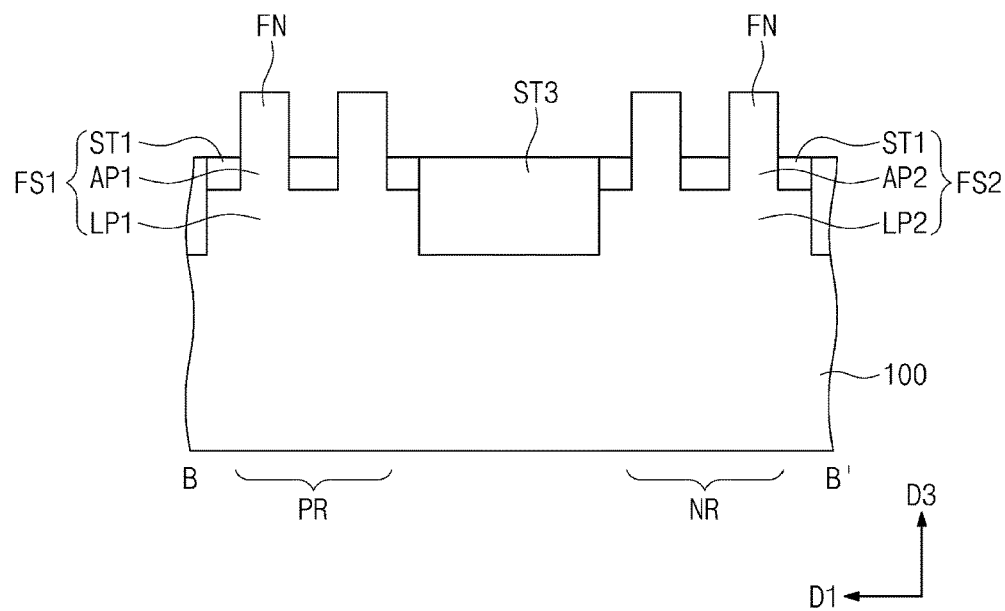
Figure 10D:
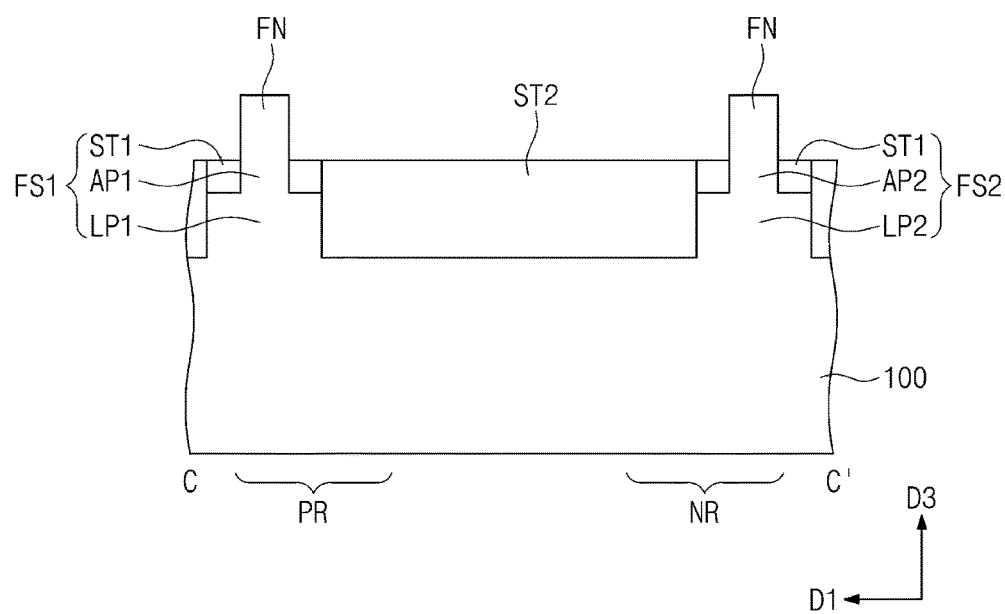
Figure 11A:
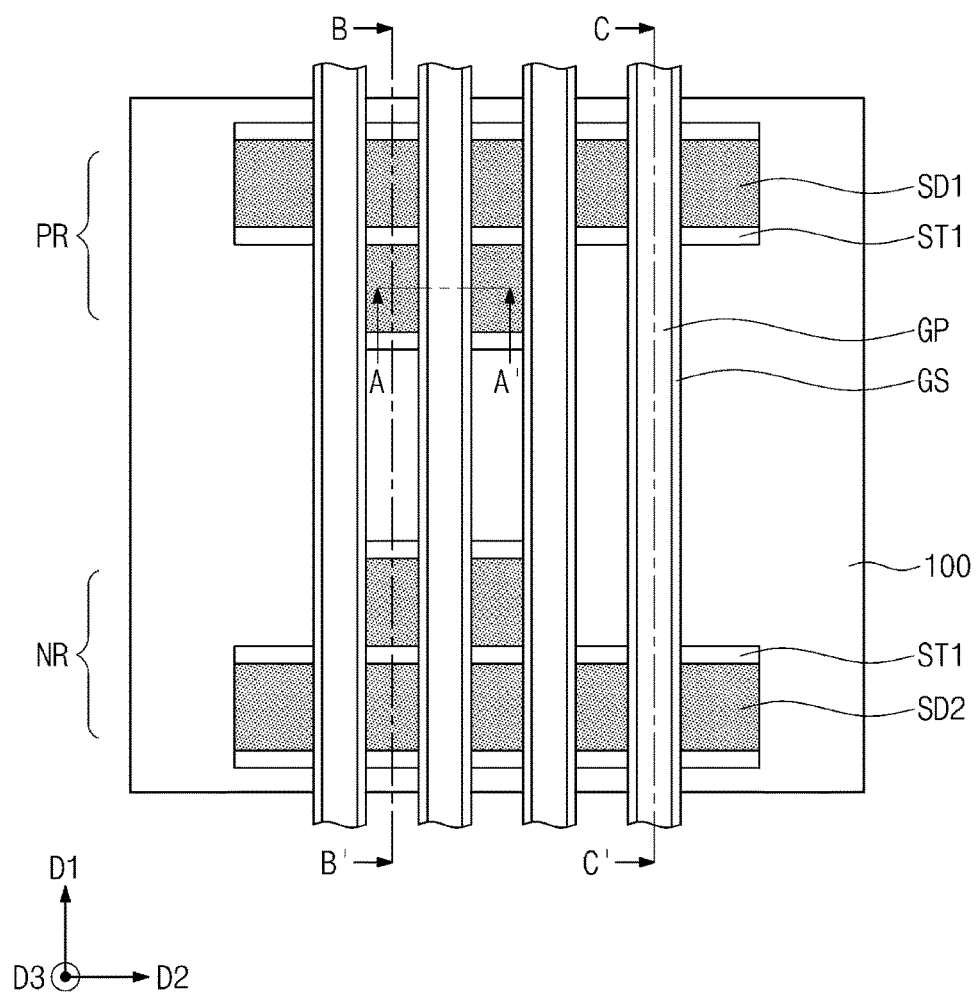
Figure 11B:
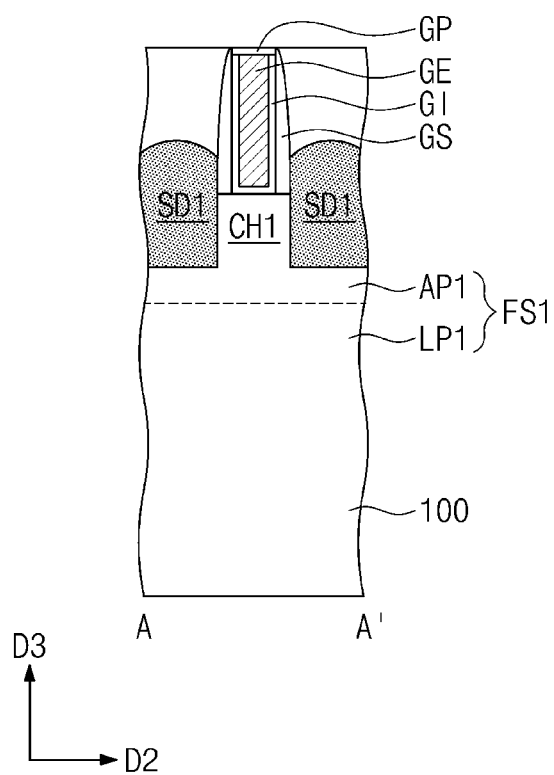
Figure 11C:
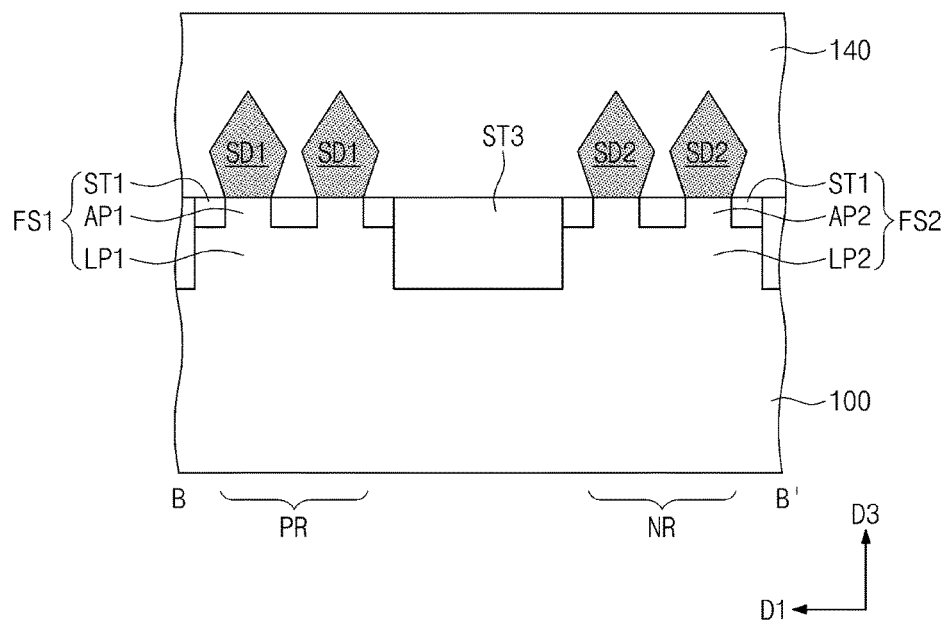
Figure 11D:
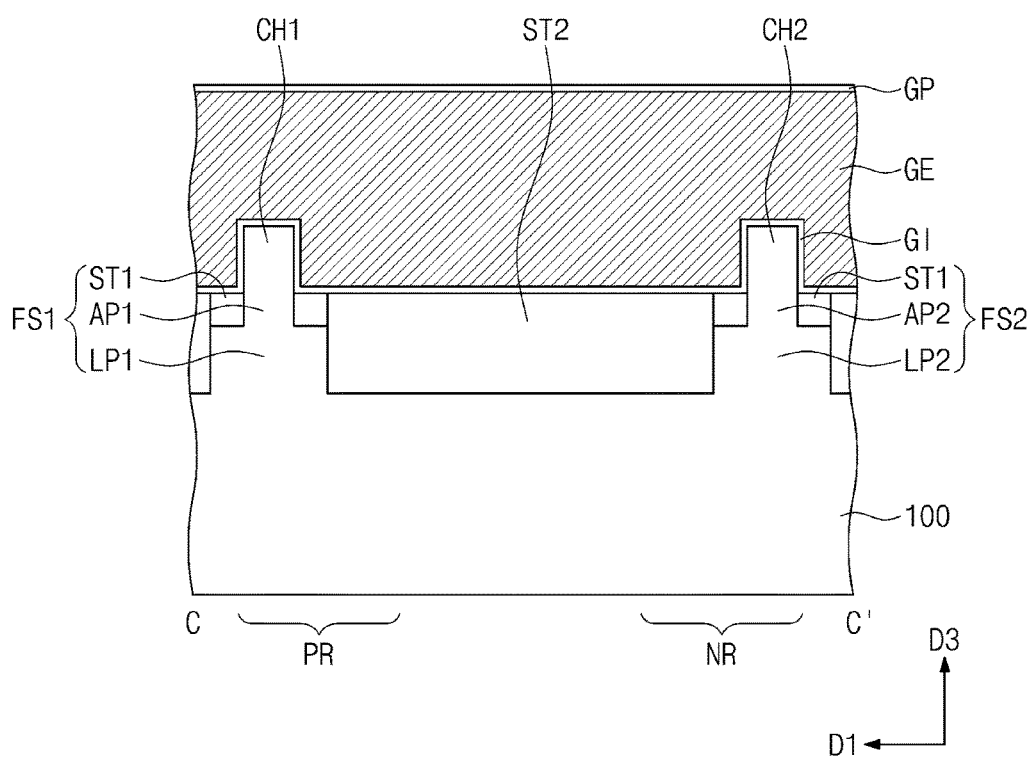

Referring to FIG. 9, a second cutting mask (CP2) for removing the corner rounding near the corner R2 may be formed. Exemplarily, there are illustrated a third cutting region (CUT3) and a fourth cutting region (CUT4) for removing corner roundings of the PMOS region PR and a fifth cutting region (CUT5) and a sixth cutting region (CUT6) for removing corner roundings of the NMOS region NR.

An etching process for removing active patterns (AP1, AP2) exposed by the third cutting region (CUT3) through the sixth cutting region (CUT6) may be performed. Using this etching process, curved active patterns (e.g., a portion of AP1 and AP2) and curved device isolation patterns (e.g., a portion of ST1) may be removed.

In the present embodiment, it was described that the corner roundings of the PMOS region PR and the NMOS region NR are removed using the second cutting mask (CP2). However, in other embodiments, a plurality of etching processes may be performed using a plurality of cutting masks.

For example, in the case where a distance between the PMOS region PR and the NMOS region NR becomes short due to a miniature of a semiconductor manufacturing process, the second cutting mask including the third cutting region (CUT3) and the fourth cutting region (CUT4) and a third cutting mask including the fourth cutting region (CUT4) and the fifth cutting region (CUT5) may be provided. In this case, a problem due to a miniature of a manufacturing process may be avoided by performing an etching process with respect to each of the cutting masks.

In the case where a distance between the third cutting region (CUT3) and the fourth cutting region (CUT4) becomes short, the second cutting mask including the third cutting region (CUT3) and the fifth cutting region (CUT5) and the third cutting mask including the fourth cutting region (CUT4) and the sixth cutting region (CUT6) may be provided. In this case, a problem due to a shortened distance between active patterns may be avoided by performing an etching process with respect to each of the cutting masks.

Referring to FIGS. 10A through 10D, a residual mask (FIGS. 8B through 8D) 110 may be removed. An upper portion of the second insulating layer (FIGS. 8B through 8D) 125 is removed and as a result, a second isolation pattern ST2 may be formed. An upper portion of the third insulating layer (FIGS. 8B through 8D) 135 is removed and as a result, a third isolation pattern ST3 may be formed. When the upper portion of the second insulating layer 125 and the upper portion of the third insulating layer 135 are removed, upper portions of the first device patterns ST1 and the buffer layer 105 are removed together and as a result, upper portions (FN) of the active patterns (AP1 and AP2) may be exposed.

Removing the upper portions of the second insulating layer 125 and the third insulating layer 135, upper portions of the first device patterns ST1, and the buffer layer 105 may include a dry etching process, for example. The dry etching process may have an etching selectivity with respect to silicon oxide.

Referring to FIGS. 11A through 11D, a first fin structure FS1 that protrudes in a direction D3 perpendicular to the substrate 100 may be formed on the PMOS region PR and a second fin structure FS2 that protrudes in a direction D3 perpendicular to the substrate 100 may be formed on the NMOS region NR.

The first fin structure FS1 may include a first lower pattern LP1, a plurality of first active patterns AP1 that protrudes in a direction perpendicular to the top surface of the first lower pattern LP1, and the first device isolation patterns ST1 covering both sidewalls of each of the first active patterns (AP1).

Gate electrodes GE crossing the active patterns (AP1 and AP2) to extend in the first direction D1 may be provided. The gate electrodes GE may be spaced apart from one another along the second direction D2. A gate insulating pattern G1 may be provided between the active patterns (AP1 and AP2) and each of the gate electrodes GE. Gate spacers GS may be provided on both sides of each of the gate electrodes GE. A capping pattern GP covering a top surface of each of the gate electrodes GE may be provided.

First source/drain patterns SD1 may be formed in upper portions of the first active patterns (AP1) between the gate electrodes GE, respectively. Second source/drain patterns SD2 may be formed in upper portions of the second active patterns (AP2) between the gate electrodes GE, respectively. For example, the first source/drain patterns SD1 may have p-type conductivity and the second source/drain patterns SD2 may have n-type conductivity. The first source/drain patterns SD1 may include an SiGe layer and the second source/drain patterns SD2 may include an Si layer or an SiC layer.

An interlayer insulating layer 140 covering the gate electrodes GE, the first source/drain patterns SD1 and the second source/drain patterns SD2, the first device isolation patterns ST1, the second device isolation patterns ST2, and the third device isolation patterns ST3 may be disposed on the substrate 100. Although not illustrated in the drawings, source/drain contacts may be further provided. The source/drain contacts may penetrate the interlayer insulating layer 140 to be electrically connected to the first source/drain patterns SD1 and the second source/drain patterns SD2, respectively.

FIGS. 1 and 2A through 11D illustrate examples of a method of manufacturing a FinFET in an active region of a varying width formed according to the inventive concept. However, the inventive concept is not limited to the manufacturing of a FinFET in an active region having the shape illustrated in these figures. A semiconductor device may be manufactured using mask patterns and/or cutting masks different from those of the embodiment described in FIGS. 1 through 11D. This will be described through FIGS. 12A through 12D.

Figure 12A:
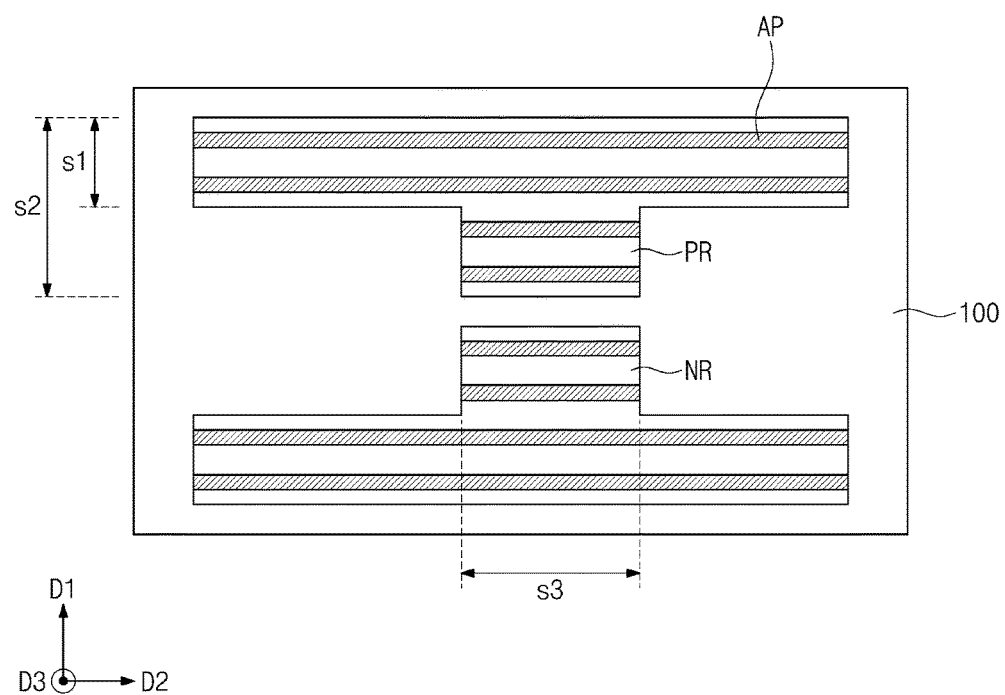
FIG. 12A is a plan view of a semiconductor device in accordance with the inventive concept.
Figure 12B:
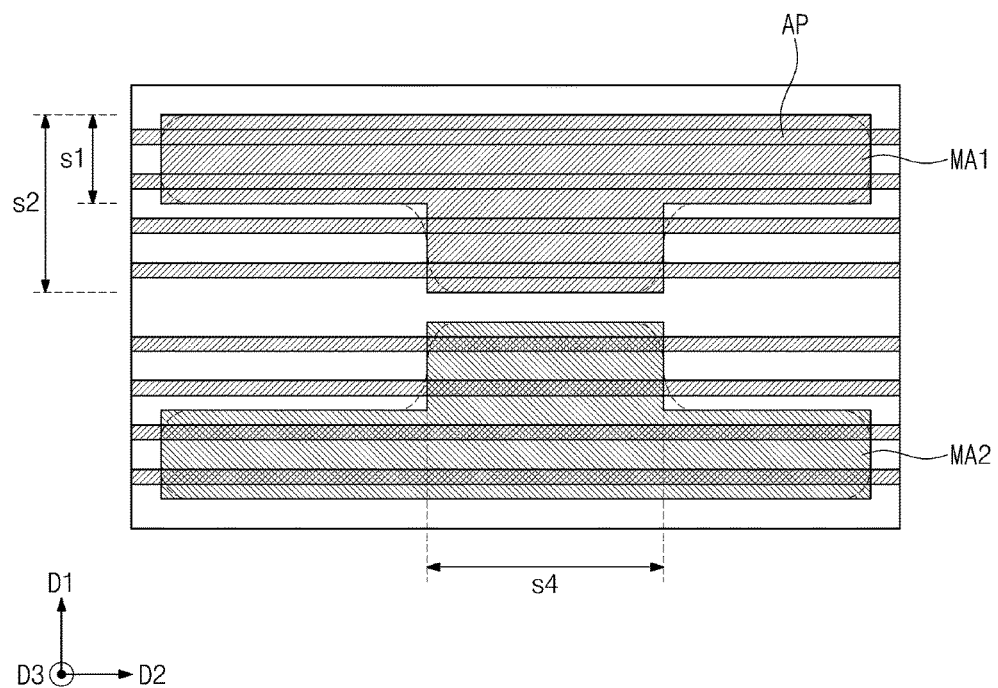
FIGS. 12B through 12E are plan views illustrating a method of manufacturing the semiconductor device illustrated in FIG. 2A.
Figure 12C:
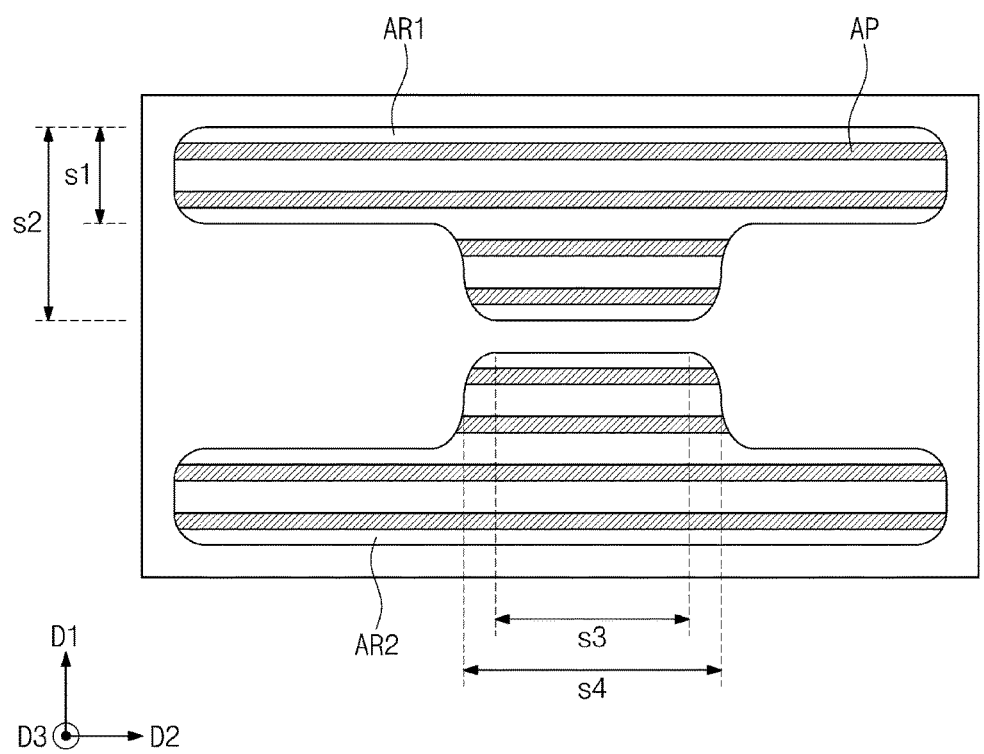
Figure 12D:
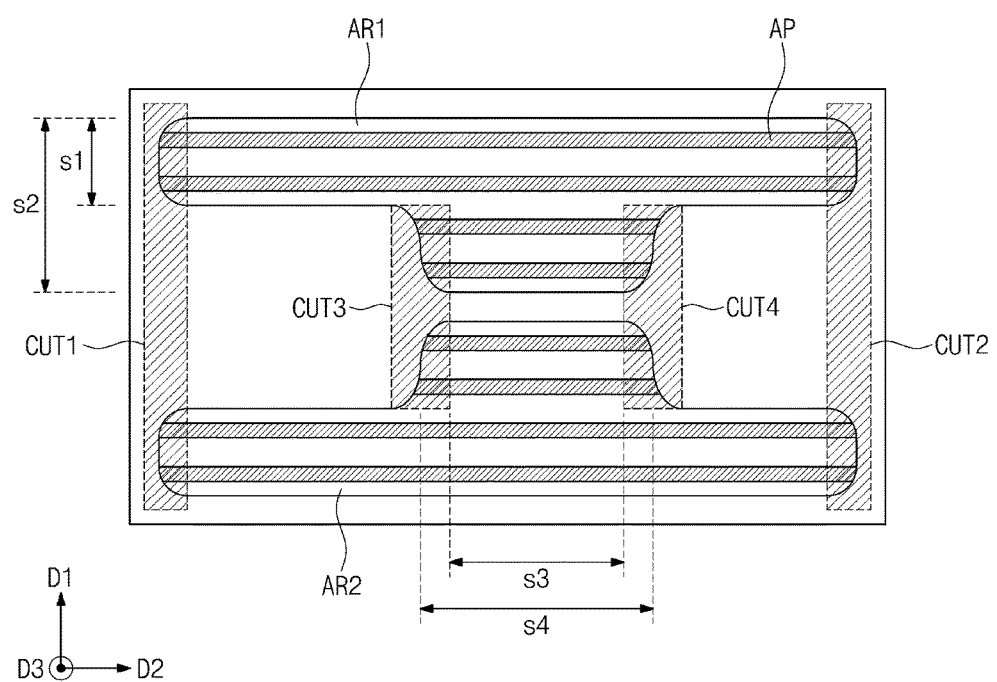

FIG. 12A is a plan view or layout of other examples of a semiconductor device in accordance with examples of the inventive concept. FIGS. 12B through 12D are plan views illustrating a method of manufacturing a semiconductor device illustrated in FIG. 12A. Unlike the embodiment described above, a description of a detailed process of manufacturing a semiconductor device will be omitted and it will be mainly described that a corner rounding is removed using a cutting mask.

Referring to FIG. 12A, it is described that a PMOS region PR and an NMOS region NR of a tapered shape each having a width of s1 and a width of s2 along a first direction D1 are provided on a substrate 100. As illustrated in the drawing, each of the PMOS region PR and the NMOS region NR may include a region in which two active patterns (AP) are formed and a region in which four active patterns (AP) are formed. For example, a length of the region including four active patterns (AP) along a second direction D2 may be s3.

Referring to FIG. 12B, mask patterns MA1 and MA2 may be formed. A first mask pattern MA1 may be provided to form the PMOS region PR and a second mask pattern MA2 may be provided to form the NMOS region NR. The mask patterns MA1 and MA2 indicated by a solid line may represent a mask pattern being actually formed. A portion indicated by a dotted line may represent a corner rounding result from performing an etching process with respect to the mask patterns MA1 and MA2.

Each of the mask patterns MA1 and MA2 may have a width of s1 and a width of s2 in the first direction D1. Each of the mask patterns MA1 and MA2 may have a polygonal shape, not a tetragonal shape. The region having the width of s2 along the first direction D1 of the mask patterns MA1 and MA2 may have a length of s4 along the second direction D2. For example, the s4 may be greater than the s3 and the length of s4 may be set considering a corner rounding to be removed by the cutting mask.

Referring to FIG. 12C, an etching process using the mask patterns MA1 and MA2 may be performed. As a result, a first active region AR1 including preliminary pin structures and the PMOS region PR may be formed and a second active region AR2 including preliminary pin structures and the NMOS region NR may be formed. As illustrated in the drawing, each of the first active region AR1 and the second active region AR2 may include corner roundings. Since the etching process is similar to that described in FIGS. 4A through 5D, overlapping contents described above are omitted.

Referring to FIG. 12D, at least one cutting mask for removing active patterns AP exposed by the cutting regions (CUT1 through CUT4) may be formed. For example, a first cutting mask for removing the active patterns of the first cutting region CUT1 and the second cutting region CUT2 may be provided. Corner roudings of both sides of each of the first active region (AR1) and the second active region (AR2) may be removed.

Thereafter, a second cutting mask for removing the active patterns of the third cutting region CUT3 and the fourth cutting region CUT4 may be provided. Similarly, corner roundings in the vicinity of the center of each of the first active region (AR1) and the second active region (AR2) may be removed by the second cutting mask. Here, the vicinity of the center may mean a point (or vicinity) where a width of the first active region (AR1) or the second active region (AR2) along the first direction D1 is changed from the s1 to the s2.

However, the order that the cutting masks are provided is not limited thereto. For example, after the second cutting mask is provided first to perform an etching process, the first cutting mask is provided to perform an etching process. Further, a cutting mask for removing the corner roundings is not limited thereto. For example, active patterns (AP) exposed by the first cutting region CUT1 and the fourth cutting region CUT4 may be removed by using the first cutting mask including the first cutting region CUT1 and the fourth cutting region CUT4. Thereafter, active patterns (AP) exposed by the second cutting region CUT2 and the third cutting region CUT3 may be removed by using the second cutting mask including the second cutting region CUT2 and the third cutting region CUT3.

In other embodiment, active patterns (AP) exposed by the first cutting region CUT1 and the third cutting region CUT3 may be removed by using the first cutting mask including the first cutting region CUT1 and the third cutting region CUT3. Thereafter, active patterns (AP) exposed by the second cutting region CUT2 and the fourth cutting region CUT4 may be removed by using the second cutting mask including the second cutting region CUT2 and the fourth cutting region CUT4.

Figure 12E:
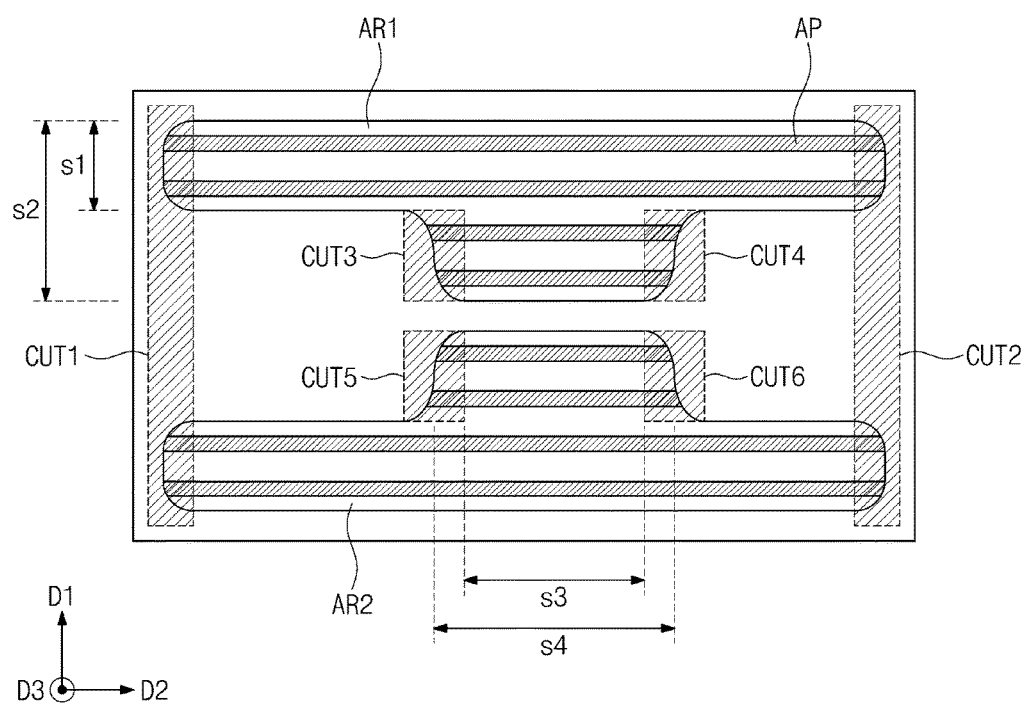

The cutting mask for removing the corner roundings may be formed in a different way from that of FIG. 12D. An embodiment of such case is illustrated in FIG. 12E. Referring to FIG. 12E, at least one cutting mask for removing the active patterns AP of the cutting regions CUT1 through CUT6 may be formed.

For example, the first cutting mask for removing active patterns exposed by the first cutting region CUT1 and the second cutting region CUT2 may be provided. Corner roudings of both sides of each of the first active region (AR1) and the second active region (AR2) may be removed. The second cutting mask for removing the active patterns exposed by the third cutting region CUT3 and the fourth cutting region CUT4 may be provided. Thereafter, the third cutting mask for removing the active patterns exposed by the fifth cutting region CUT5 and the sixth cutting region CUT6 may be provided.

In other embodiment, the first cutting mask for removing active patterns exposed by the first cutting region CUT1 and the second cutting region CUT2 may be provided. Corner roudings of both sides of each of the first active region (AR1) and the second active region (AR2) may be removed by using the first cutting mask. The second cutting mask for removing the active patterns exposed by the third cutting region CUT3 and the sixth cutting region CUT6 may be provided. Thereafter, the third cutting mask for removing the active patterns exposed by the fourth cutting region CUT4 and the fifth cutting region CUT5 may be provided.

As described above, it is described that a plurality of cutting masks are provided to remove the active patterns exposed by the cutting regions CUT1 through CUT6. However, cutting regions included in the cutting mask is not limited thereto. That is, a plurality of cutting masks which include various combinations of cutting regions may be provided considering a variety of factors such as a resolution of a semiconductor manufacturing process, a distance between the first active region (AR1) and the second active region (AR2), etc.

Figure 13:
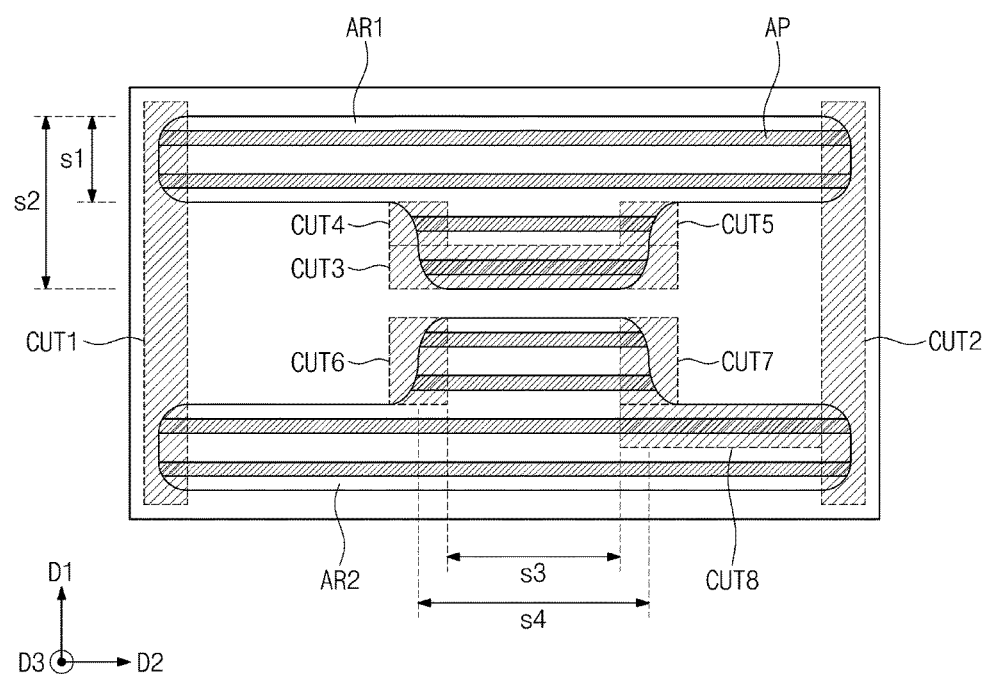
FIG. 13 is a drawing illustrating a method of manufacturing a semiconductor device in accordance with the inventive concept.

FIG. 13 is a drawing illustrating a method of manufacturing a semiconductor device in accordance with the inventive concept. The drawing may correspond to providing at least one cutting mask including the cutting regions described through FIG. 12D or 12E. In the present embodiment, besides removing a corner rounding, it is described that a cutting mask is used to adjust the number of active patterns (AP) along the first direction D1.

The first cutting region CUT1 and the second cutting region CUT2 may be associated with removing corner roundings of both sides of the first active region AP1 and the second active region AP2. The third cutting region CUT3, the fourth cutting region CUT4, the fifth cutting region CUT5, and the sixth cutting region CUT6 may be associated with removing corner roundings in the vicinity of the center of the first active region AP1 and the second active region AP2. The third cutting region CUT3 may be associated with adjusting a width of the first active region AP1 along the first direction D1. An eighth cutting region CUT8 may be associated with adjusting a width of the second active region AP2 along the first direction D1.

To remove the corner roundings of the first active region AP1 and the second active region AP2 and adjust widths of the first active region AP1 and the second active region AP2, a plurality of cutting masks including various combinations of the cutting regions may be provided.

As an example, to remove corner roundings of both sides of the first active region AP1 and the second active region AP2, the first cutting mask including the first cutting region CUT1 and the second cutting region CUT2 may be provided. The second cutting mask including the third cutting region CUT3 and the eighth cutting region CUT8 may be provided to adjust a width of the first active region AP1 along the first direction D1 and a width of the second active region AP2 along the first direction D1. The third cutting mask including the fourth cutting region CUT4, the fifth cutting region CUT5, the sixth cutting region CUT6, and the seventh cutting region CUT7 may be provided to remove corner roundings in the vicinity of the center of the first active region AP1 and the second active region AP2.

However, the present inventive concept is not limited thereto. A plurality of cutting masks including various combinations of the cutting regions may be provided considering a resolution of a semiconductor manufacturing process, a distance between the first active region (AP1) and the second active region (AP2), etc.

According to the inventive concept described above, using a plurality of mask patterns and at least one cutting mask, a corner rounding that may occur when an active region having a varying width is formed on a substrate may be removed. Thus, an error such as a short, which might otherwise occur due to a reduced space between devices in a scaled down semiconductor device, may be prevented.

Although examples of inventive concept have been described, it should be understood that numerous modifications, changes, variations, and substitutions can be devised by those skilled in the art without departing from the true spirit and scope of the inventive concept as set forth in the appended claims.

What is claimed is:
1. A method of manufacturing a semiconductor device comprising:
    forming active patterns extending in a first direction and spaced apart from one another along a second direction perpendicular to the first direction on a substrate;

forming a polygonal mask pattern having a first width and a second width along the second direction on the active patterns;
forming an active region having the first width and the second width by executing a first etching process using the mask pattern;
forming a first cutting mask for removing a first corner rounding at which a width of the active region is the first width;
removing the first corner rounding by executing a second etching process using the first cutting mask;
forming a second cutting mask for removing a second corner rounding at which the width of the active region is changed from the first width to the second width; and
removing the second corner rounding by executing a third etching process using the second cutting mask.

2. The method of claim 1, wherein forming the active patterns comprising:
forming an active region extending the first direction on the substrate;
forming first trenches extending in the first direction and spaced apart from one another along the second direction on the substrate; and
forming first insulating layers filling the first trenches.

3. The method of claim 1, wherein removing the first corner rounding comprising:
forming a second trench that partly defines the active region; and
forming a second insulating layer filling the second trench.

4. The method of claim 1, further comprising:
forming a gate electrode extending along the second direction; and
forming source/drain patterns in upper portions of the active patterns at opposite sides of the gate electrode.

5. The method of claim 1, wherein the active region is a PMOS region or an NMOS region.

6. The method of claim 1, wherein the second width is greater than the first width.

7. A method of manufacturing a semiconductor device comprising:
forming active patterns extending in a first direction and spaced apart from one another along a second direction perpendicular to the first direction on a substrate;
forming a polygonal mask pattern having a first width and a second width along the second direction on the active patterns;
forming an active region having the first width and the second width by executing a first etching process using the mask pattern;
forming a first cutting mask for removing a first corner rounding at which the width of the active region is changed from the first width to the second width; and
removing the first corner rounding by executing a second etching process using the first cutting mask.

8. The method of claim 7, wherein forming the active patterns comprising:
forming an active region extending in the first direction on the substrate;
forming first trenches extending in the first direction and spaced apart from one another along the second direction on the substrate; and
forming first insulating layers filling the first trenches.

9. The method of claim 7, further comprising:
forming a second cutting mask for removing at least one second corner rounding except the first corner rounding among corner roundings of the active region; and
removing the at least one second corner rounding by executing a second etching process using the second cutting mask.

10. The method of 9, wherein forming the second cutting mask and executing the second etching process are performed before forming the first cutting mask and executing the first etching process.

11. The method of claim 7, further comprising:
forming a gate electrode extending in the second direction on the active region; and
forming source/drain patterns in upper portions of the active pattern at opposite sides of the gate electrode.

12. The method of claim 7, wherein the active region is a PMOS region or an NMOS region.

13. A method of manufacturing a semiconductor device comprising:
forming first trenches that define active pattern extending in a first direction and spaced apart from one another along a second direction perpendicular to the first direction on a substrate;
forming first insulating layers filling the first trenches;
forming a polygonal mask pattern having a first width and a second width in the second direction;
forming a second trench for defining a portion having the first width of the polygonal active region by executing a first etching process using the mask pattern;
forming second insulating layers filling the second trenches;
forming a first cutting mask for removing a first corner rounding at which a width of the active region is changed from the first width to the second width; and
removing the first corner rounding by executing a first etching process using the first cutting mask.

14. The method of claim 13, further comprising:
forming a second cutting mask for removing at least one second corner rounding except the first corner rounding among corner roundings of the active region; and
removing the at least one second corner rounding by executing a second etching process using the second cutting mask.

15. The method of claim 14, wherein forming the second cutting mask and executing the second etching process are performed before forming the first cutting mask and executing the first etching process.

16. The method of 13, further comprising:
forming a gate electrode extending in the second direction on the active region; and
forming source/drain patterns in upper portions of the active pattern at opposite sides of the gate electrode.

17. The method of claim 13, wherein the active region is a PMOS region or an NMOS region.

18. The method of claim 13, wherein the second width is greater than the first width.

* * * * *